US012699820B2

(12) United States Patent   (10) Patent No.: US 12,699,820 B2
Yeykelis et al.   (45) Date of Patent: Aug. 4, 2026

(54) GENERATING ARTIFICIAL INTELLIGENCE SUBJECTS AND MEDIA STIMULI TO SIMULATE AND PREDICT HUMAN RESPONSES

(71) Applicant: Inspiration Point Labs LLC, Mountain View, CA (US)

(72) Inventors: Leonid Yeykelis, Mountain View, CA (US); James Cummings, Boston, MA (US); Byron Reeves, Palo Alto, CA (US)

(73) Assignee: Viewpoints AI, Inc., San Francisco, CA (US)

( * ) Notice: Subject to any disclaimer, the term of this patent is extended or adjusted under 35 U.S.C. 154(b) by 0 days.

(21) Appl. No.: 18/759,415

(22) Filed: Jun. 28, 2024

(65) Prior Publication Data

US 2026/0004019 A1   Jan. 1, 2026

(51) Int. Cl.
*G06F 30/20* (2020.01)
*G06Q 30/0242* (2023.01)

(52) U.S. Cl.
CPC ......... *G06F 30/20* (2020.01); *G06Q 30/0243* (2013.01)

(58) Field of Classification Search
CPC ........................... G06F 30/20; G06Q 30/0243
USPC ............................................................. 703/2
See application file for complete search history.

(56) References Cited

U.S. PATENT DOCUMENTS

| | | | | |
|---|---|---|---|---|
| 2013/0234933 A1* | 9/2013 | Reitan | ..................... | G06F 3/011 |
| | | | | 345/156 |
| 2018/0181854 A1* | 6/2018 | Koukoumidis | ........ | G06N 3/006 |
| 2024/0111920 A1* | 4/2024 | Loucks | ................... | G06F 9/543 |
| 2025/0094690 A1* | 3/2025 | DeCharms | ............. | G06N 20/00 |

OTHER PUBLICATIONS

Aher, Gati et al., "Using Large Language Models to Simulate Multiple Humans and Replicate Human Subject Studies", Proceedings of the 40th International Conference on Machine Learning, 2023, 35 pages.
Argyle, Lisa P., "Out of One, Many: Using Language Models to Simulate Human Samples", Political Analysis (2023), vol. 31, pp. 337-351.
Dillion, Danica et al., "Can AI Language Models Replace Human Participants?", Trends in Cognitive Sciences, Jul. 2023, vol. 27, No. 7, pp. 597-600.
Grossmann, Igor et al., "AI and the Transformation of Social Science Research", Science, Jun. 16, 2023, vol. 380, Issue 6650, pp. 1108-1109.
Conjointly, "Synthetic Respondents are the Homoeopathy of Market Research", Mar. 11, 2024, 20 pages.

* cited by examiner

*Primary Examiner* — Andre Pierre Louis
(74) *Attorney, Agent, or Firm* — Raubvogel Law Office

(57) ABSTRACT

According to various embodiments described herein, mechanisms are provided for employing artificial intelligence (AI), such as in the form of large language models, to simulate responses to stimuli. A study may be created, a set of AI subjects having specified characteristics may be generated, and stimuli may be generated and presented to such AI subjects. Responses may be recorded and analyzed, and reports may be generated based on such analysis. The described system and method provide mechanisms for making research and/or product decisions based on observed responses by the AI subjects to stimuli.

21 Claims, 26 Drawing Sheets

501

Procedure

An experimental study consisting of a 3 (CSR) × 2 (Recovery) between-subjects factorial design was used. Three CSR conditions (*positive CSR information, negative CSR information, and no CSR information [control]*) were matched with two service recovery conditions (*positive and negative*). Participants were randomly assigned to one of the six experimental conditions. The scenarios used in the study are shown in Appendix A.

First, participants were presented with the CSR scenario, a company description containing positive, negative, or no green practices information. Positive CSR was represented by exemplary green practices, and negative CSR was represented by poor green practices. The control group did not receive any green practices information but just a company description. The CSR scenarios were developed based on Sen and Bhattacharya's (2001) study. Following the CSR scenario, participants were asked questions regarding the company's green practices (manipulation check), their personal environmental beliefs (covariate), and the believability of the scenarios.

The second part of the survey asked participants to role-play as casual restaurant customers who experience a service failure and a recovery described by a written scenario based on Smith et al. (1999). The service failure involved inattentive service by the server, and the service recovery description presented either an appropriate response from the managers accompanied by an apology and compensation (positive) or a delayed response from the managers with no apology or compensation (negative). After reading the second scenario, participants answered questions designed to measure their perceptions of the service recovery (manipulation check), dependent constructs, and scenario realism.

502

```
CSR_study = {
  "stimuli_prompt_respond": {
    "CSR": "First, consider the following company description.",
    "Service Recovery": "Moreover, imagine you are a customer experiencing the following
situation at the restaurant.",
  },
  "stimuli_prompt_append": "Intake you visualize yourself in this scenario, please respond to
the following questions.",
  },
  "Your responses should reflect your experience and perceptions as
if you were actually ",
  "in the restaurant in the scenario, keeping mind that", "stimuli": {
    "CSR": {
      "positive": "Marina Pier Restaurant is a seafood restaurant chain in the central
Florida area. The restaurant has a seating capacity of 150 and has been serving its clients in
the central Florida area since 2005. It is a family-style, casual-dining restaurant chain, and
the food is moderately priced. Recently, this restaurant chain has been acclaimed by the local
media for their environmentally responsible practices. This company has been voted the most
performing restaurant in green practices from 2005 to 2011 by the Corporate Social
Responsibility Observer, a well-known organization that focuses on the promotion and recognition
of environmentally friendly businesses. Marina Pier Restaurant supports local environmental
projects and buys products from local farmers whenever possible. They use energy-efficient
lamps, low-flow water faucets, and recyclable products in all of their restaurants. Marina Pier
Restaurant also conducts waste assessment of all of their locations, and it has hired a local
company to pulp and compost their food waste on a weekly basis.", "negative": "...", "control": "Marina Pier Restaurant is a seafood restaurant chain in the central
Florida area. The restaurant has a seating capacity of 150 and has been serving its clients in
the central Florida area since 2005. It is a family-style, casual-dining restaurant chain, and
the food is moderately priced.", "Service Recovery": {
      "positive": "It is your birthday, and you take a few of your friends to Marina Pier
Restaurant. As soon as you get there, you are seated at your table, and the waiter comes to take
your order. You place your order, and soon afterward the waiter brings your entrees and leaves
without asking if you need anything else. The waiter never brings your beverages, and he doesn't
stop back to check on you while you're eating. Finally, he comes to your table and drops off the
bill without asking if you want anything more. You decide to complain about the poor service to
the manager. After you explained the problem to the manager, he sincerely apologized for the
problem. He said that he would address the problem accordingly and apologized again. Finally, he
offered you and each person in your party a 10% discount and asked if there was anything else
then he could do to serve you better.", "negative": "...",
    },
  }, "conditions": {
    "CSR": "positive", "positive", "Service Recovery": "positive",
    "CSR": "positive", "positive", "Service Recovery": "negative",
    "CSR": "negative", "Service Recovery": "positive",
    "CSR": "negative", "Service Recovery": "negative",
    "CSR": "control", "Service Recovery": "positive",
    "CSR": "control", "Service Recovery": "negative",
  },
}
```

FIG. 5B

Measures

For the CSR manipulation check, three items (e.g., *This restaurant supports good causes*, α = .97) were adapted from Berens, Cees, Van Riel, and Van Bruggen (2005) and Lichtenstein, Drumright, and Braig (2004). For the *service recovery manipulation check*, a 7-item justice scale (e.g., *The outcome I received was fair*, α = .97) from Blodgett, Hill, and Tax (1997) was used. In addition, the believability of the company description with green-practices information ($r$ = .75) and the realism of the service recovery scenario were assessed ($r$ = .65).

*Customer satisfaction* was assessed by five items (e.g., *I am satisfied with my overall experience with this restaurant*, α = .96) adapted from Olorunniwo, Hsu, and Udo (2006); and *trust* was measured via four items (e.g., *I feel that this company is trustworthy*, α = .96) from Sirdeshmukh, Singh, and Sabol (2002). *Word-of-mouth recommendation* intentions were measured by four items (e.g., *I would recommend this restaurant to others*, α = .88) from Blodgett et al. (1997) and Keillor, Hult, and Kandemir (2004). *Repeat patronage* intentions were assessed by three items (e.g., *I would eat at this restaurant again*, α = .79) from Blodgett et al. (1997) and Leung and Kim (2002). In addition, participants' general environmental beliefs were measured by eight items (e.g., *Humans are severely abusing the environment*, α = .79) from Dunlap, Van Liere, Mertig, and Jones (2000) from Schubert et al. (2010), and were included as a covariate in the analysis.

All items were assessed on a 7-point Likert-type scale, and the scale items used in the study appear in Appendix B. A pretest was conducted with 199 undergraduate students to assess the manipulations and the constructs used in the study. The pretest results indicated that the research design and measurement items were sound and suitable; thus, we proceeded to the main study.

501

502

```
CSR_study = {
"measures": {
"CSR": {
"questions": {
"This restaurant supports good causes.",
"This restaurant behaves responsibly regarding the environment.",
"This restaurant has a strong record of environmentally friendly
practices."
},
"scale": "Respond on a 7-point Likert-type scale (1 = strongly
disagree; 4 = neutral; 7 = strongly agree)"
},
"Service recovery evaluation": {
"questions": {
"The outcome I received was fair.",
"In resolving the problem, the restaurant gave me what I
needed.",
"With respect to its policies and procedures, the restaurant
handled the problem in a fair manner.",
"The restaurant responded quickly to my needs.",
"The manager put the proper effort into resolving my problem.",
"In dealing with my needs, the manager treated me in a courteous
manner.",
"I was treated fairly during my interactions with the manager."
},
"scale": "Respond on a 7-point Likert-type scale (1 = strongly
disagree; 4 = neutral; 7 = strongly agree)"
},
"Word-of-mouth recommendation": {
"questions": {
"I would recommend this restaurant to others.",
"I would say good things about this restaurant.",
"I would complain to others about this restaurant.",  # Note:
Reversed-coded item
"I would warn others about this company."  # Note: Reversed-coded
item
},
"scale": "Respond on a 7-point Likert-type scale (1 = strongly
disagree; 4 = neutral; 7 = strongly agree)"
...
}
```

Create Simulated Study

What media messages would you like to test?

1211 — Overall Study Settings

1212 — Stimuli

1213 — Images

1214 — Text

1215

1240A

1240B

GENERATING ARTIFICIAL INTELLIGENCE SUBJECTS AND MEDIA STIMULI TO SIMULATE AND PREDICT HUMAN RESPONSES

TECHNICAL FIELD

The present document relates to techniques for using artificial intelligence to build stimulus sets for studying media effects and for simulating human responses to such stimuli.

BACKGROUND

Research about human responses to media is critical to successful business decisions. However, existing techniques for such research are often cumbersome, slow, imprecise, and expensive. In fields such as marketing, advertising, entertainment, media production, product development and user experience, psychological and social science research, education, healthcare, and others, it is often necessary to understand how humans respond to media stimuli (such as ads, movies, TV shows, music, user interfaces, and the like). Human responses often vary based on factors such as demographics, psychographics, preferences, emotional state, and/or other variables, resulting in the necessity to recruit large samples of subjects. It may often be difficult or impossible to find sufficiently large samples of subjects, particularly for subpopulations that are difficult to recruit (such as children and adolescents, international groups, language and cultural minorities, and/or the like). In addition, running long studies with those subjects can be time-consuming.

Additional limitations and difficulties can arise when using human subjects for researching responses to stimuli. There are limits to how much stimuli testing can be performed with each individual, because people can only feasibly respond to a limited number of stimuli in a single research study. Costs may be high or even prohibitive, due to the need to offer incentives, perform recurring functions, and/or rerun multiple studies. Additionally, such efforts often require sampling of media stimuli themselves, either through direct sampling of existing media (which may be difficult to identify or access) or through creation and/or modification of a given media stimulus to produce needed variance for testing, therefore requiring specialized production and editing.

Existing techniques include audience natural and laboratory experiments, surveys, clinical trials, and A/B tests within existing media interactions. Each of these techniques has limitations and drawbacks, and as mentioned, recruiting subjects may be slow and expensive, and may be limited to small or unrepresentative samples that can feasibly be recruited for particular designs. Additional limitations exist, including limits on the number of messages that can be tested and the number of questions that can be asked in one research project. Additionally, when actual customers are used, there is potential brand risk, meaning that exposing customers to suboptimal messages can lead to negative perceptions of the brand, negative publicity, and/or potential loss of business. In some studies, there are also potential risks to the participants themselves, such as stress or other negative responses. Finally, using existing approaches, in many cases it may not be feasible to replicate studies, an important criterion for acceptance of research results, or to elaborate on the causal mechanisms for research questions that explain why results occur as they do.

SUMMARY

According to various embodiments described herein, mechanisms are provided for employing artificial intelligence (AI), such as in the form of large language models, to simulate human responses to stimuli. The techniques described herein allow for interactions involving varying human profiles at scale with stimulus sets at scale. The described system and method can generate a quantitative dataset of simulated responses to variable measures, which constitute valuable empirical research that may be used to guide product and design decisions.

The described system and method may also allow for the testing of responses to media before any human users are involved, so as to allow for predictive modeling of future human responses and thereby anticipating the potential impact of media. The described system and method may also allow for testing in situations where human subjects may be difficult to reach, and/or where stimulus characteristics may be difficult to reproduce.

The described system and method may simulate unique human profiles at scale quickly (for example, in seconds or minutes), and may simulate stimuli sets quickly at scale. A quantitative dataset of simulated responses to variable measures may be generated, which may be used to guide research and product decisions. Accordingly, the described system and method provide the ability to translate research questions into a query structure that uses any combination of LLMs to create a sample of simulated personas that can generate simulated responses that can easily be analyzed for statistical significance, leading to optimization for the media message that has the highest effect. In addition, the described system and method facilitate rapid iteration of studies with minor tweaks, thereby allowing for optimization not just between compared stimuli within a given study, but also across a series of multiple study iterations.

The described system and method thus allows research to be conducted in minutes that simulates processes of human responses that naturally occur in multiple time domains, from seconds and minutes, to days and weeks, and even years. For example, research can be conducted about different responses within a turn-based chat interaction with a human. The described system can find the most effective responses to use in the short time domain of single utterances, or can yield guidance about general patterns within an interaction that unfolds over longer periods, including days, weeks, months, and years.

In all time domains, the described system is much less expensive than conventional approaches, and may be more accurate.

Accordingly, the described system and method provide functionality to perform any or all of the following:

Conduct simulated research from scratch by simulating all the elements of a study or experiment;

Generate studies across multiple time domains, including in near real-time, to understand questions important in guiding interactions (for example, to determine the best responses during a chat interaction);

Enable direct input into products (for example, to change the interface in real-time as a result of an experiment, and/or to perform intermediate steps such as generating wireframe recommendations);

Create a prompt grammar for any arbitrary subject characteristics which may or may not be based on characteristics found in a research paper or product logs;

Create a prompt grammar for any arbitrary media stimuli (replicated or wholly original) characteristics given a research paper or product log;

Create a prompt grammar for any arbitrary subject measures which may or may not be based on subject measures found in a research paper or product logs;

Assign subjects (also referred to as participants) to specific or random stimuli and/or measures, including the ability for the subjects to answer survey questions which may be open-ended and or scaled;

Perform experiments in seconds and within a specified interactive sequence;

Generate a quantitative dataset with the subjects' responses to the measures;

Generate a recommendation report about different stimulus options based on the simulated research;

Generate new stimuli that can replace original material with greater effectiveness.

Further details and variations are described herein.

BRIEF DESCRIPTION OF THE DRAWINGS

The accompanying drawings, together with the description, illustrate several embodiments. One skilled in the art will recognize that the particular embodiments illustrated in the drawings are merely exemplary, and are not intended to limit scope.

FIGS. 5A, 5B, and 5C depict examples of the creation of a StudyConfigurationObject according to one embodiment.

FIG. 10 depicts an example of a dataset that may be generated and saved from the collected responses.

DETAILED DESCRIPTION OF THE EMBODIMENTS

Figure 1:
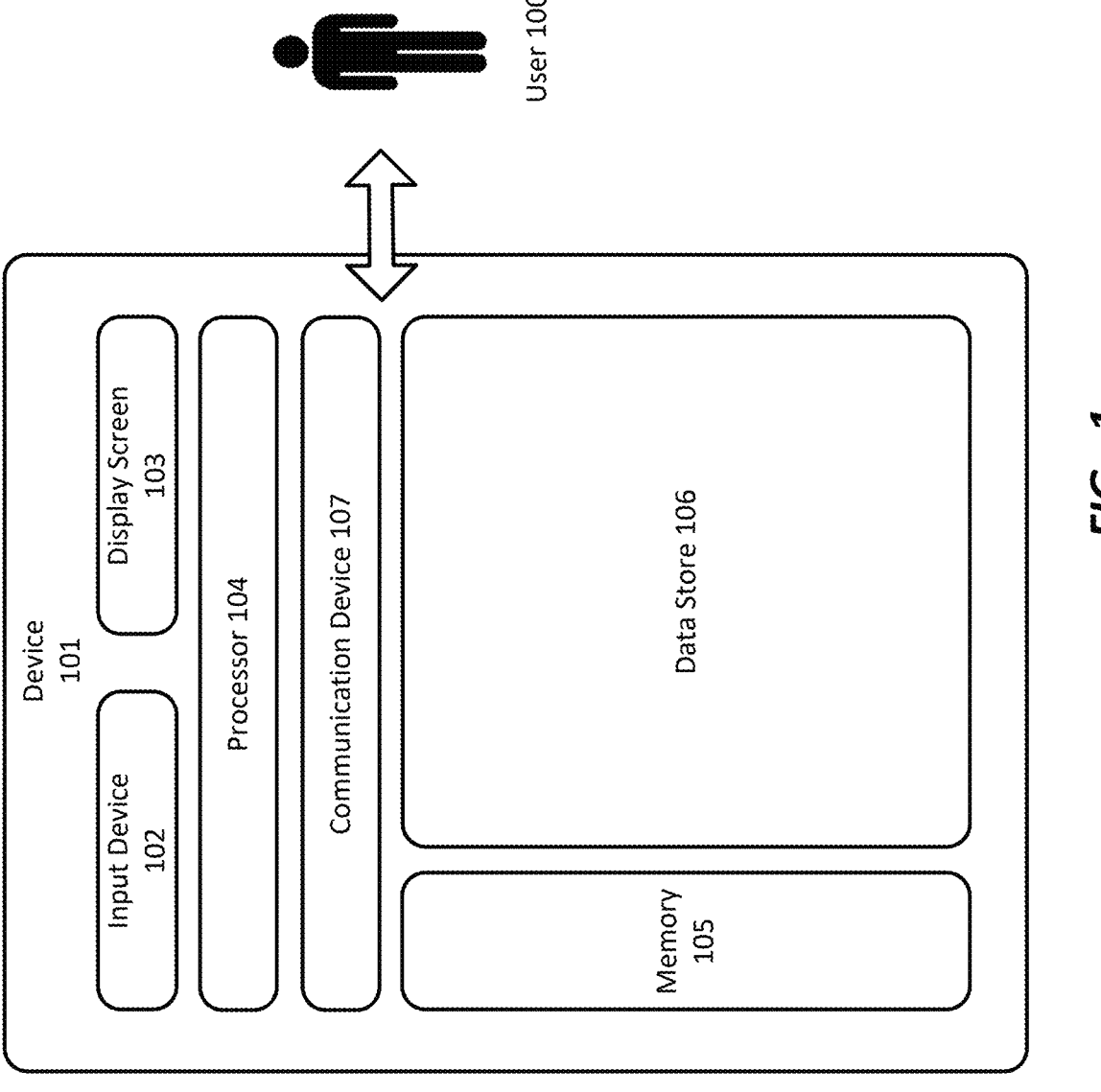
FIG. 1 is a block diagram depicting a hardware architecture for implementing the techniques described herein according to one embodiment.

The systems and methods set forth herein may be applied in many contexts in which it may be useful to simulate and/or predict human responses to media stimuli, such as to determine potential effectiveness of marketing campaigns, assess usability of software and other products, identify potential problems, formulate research questions instrumental to testing new media psychology theory, and/or the like. Such techniques may be useful to provide feedback associated with different versions of products, media, and/or other items, and may be used to replace and/or enhance conventional mechanisms for testing such items. Accordingly, one context for the techniques presented herein is to increase the robustness of testing methods.

For illustrative purposes, the systems and methods are described in connection with a real-time experiment that may be performed in a turn-based chat interaction. AI subjects (also referred to as "simulated humans", "simulated participants", "AI participants", or "virtual personas") may be generated and enlisted to participate in conversations that simulate responses to potential media messages, wherein each turn may take into account a user's message and message history up to that point.

However, the described techniques may also be used in other contexts, and are not limited to the specific application(s) set forth herein. For example, the described techniques may be applied to simulate human responses to stimuli in other contexts, and are not necessarily limited to conversations in a chat interaction. As another example, the described techniques may be applied to a longitudinal study such as one testing the effectiveness of an advertising campaign over several months.

In addition, for illustrative purposes, systems and methods are described in connection with studies involving individuals and their responses to stimuli. However, the described techniques may also be applied in contexts where responses of groups or other entities are considered, such as for example, organizations, families, schools, governments, countries, and/or companies.

In addition, the particular hardware arrangements depicted and described herein are simplified examples for illustrative purposes.

In some embodiments, one or more hardware and/or software components, as shown and described below in connection with FIGS. 1 and 2, may be used to implement the system and method described herein. In at least one embodiment, such components may be implemented in a cloud computing-based client/server architecture, using, for example, Amazon Web Services, which is an on-demand cloud computing platform available from Amazon.com, Inc. of Seattle, Washington. Therefore, for illustrative purposes, the system and method are described herein in the context of such an architecture. One skilled in the art will recognize, however, that the systems and methods described herein may be implemented using other architectures, such as for example a standalone computing device rather than a client/server architecture.

Further, the functions and/or method steps set forth herein may be carried out by software running on one or more of device(s) 101, client device(s) 108, server(s) 110, and/or other components. This software may optionally be multifunction software that is used to retrieve, store, manipulate, and/or otherwise use data stored in data storage devices and/or to carry out one or more other functions.

Definitions and Concepts

For illustrative purposes and for ease of explanation, the following definitions and concepts are used herein:

A "customer", "user", or "end user", such as user 100 referenced herein, may be an individual person, or may be an enterprise, company, family, representative, and/or group that may optionally include one or more individuals.

A "data store", such as data store 106 referenced herein, may be any device capable of digital data storage, including any known hardware for nonvolatile and/or volatile data storage. A collection of data stores may form a "data storage system" that can be accessed by multiple customers.

A "computing device" or "device", such as client device 101 or 108, is any electronic device capable of digital data processing. In at least one embodiment, the device may communicate with a server such as server 110, provide output to a customer, and accept input from a customer.

A "server", such as server 110, may be a computing device that is configured to run software for back-end processing, and may also provide data storage, either via a local data store, or via connection to a remote data store.

An "AI subject" (also referred to as a "simulated human", "AI participant", or "virtual persona") may be a software-based entity capable of receiving stimuli and generating a response to such stimuli. In at least one embodiment, such entities may be implemented using a large language model (LLM) and/or other machine learning technique(s). In other embodiments, such entities may be implemented via other approaches. Notably, in at least one embodiment, AI subjects may be capable of processing multi-modal stimuli, such as for example images, sounds, and text from videos, VR sims, and/or the like.

System Architecture

According to various embodiments, the systems and methods described herein may be implemented on any electronic device or set of interconnected electronic devices, each equipped to receive, store, and present information. Each electronic device may be, for example, a server, desktop computer, laptop computer, smartphone, tablet computer, smart watch or other wearable device, and/or the like. As described herein, some devices may be designated as client devices, which are generally operated by end users. Other devices may be designated as servers, which generally conduct back-end operations and communicate with client devices (and/or with other servers) via a communications network such as the Internet. In at least one embodiment, the techniques described herein may be implemented in a cloud computing environment using techniques that are known to those of skill in the art.

In addition, one skilled in the art will recognize that the techniques described herein may be implemented in other contexts, and indeed in any suitable device, set of devices, or system capable of interfacing with existing enterprise data storage systems. Accordingly, the following description is intended to illustrate various embodiments by way of example, rather than to limit scope.

Referring now to FIG. 1, there is shown a block diagram depicting a hardware architecture for practicing the described system, according to one embodiment. Such an architecture can be used, for example, for implementing the techniques of the system in a computer or other device 101. Device 101 may be any electronic device, including one of those listed above.

In at least one embodiment, device 101 includes a number of hardware components that are well known to those skilled in the art. Input device 102 can be any element that receives input from user 100, including, for example, a keyboard, mouse, stylus, touch-sensitive screen (touchscreen), touchpad, trackball, accelerometer, microphone, or the like. Input can be provided via any suitable mode, including for example, one or more of: pointing, tapping, typing, dragging, and/or speech. In at least one embodiment, input device 102 may be implemented as a device that can unobtrusively assess a reaction without intentional input from user 100, for example by monitoring psychophysiological changes or by capturing behavioral choices.

In at least one embodiment, input device 102 can be omitted or functionally combined with one or more other components.

Data store 106 can be any magnetic, optical, or electronic storage device for data in digital form; examples include flash memory, magnetic hard drive, CD-ROM, DVD-ROM, or the like. In at least one embodiment, data store 106 may store information that can be utilized and/or displayed according to the techniques described below. Data store 106 may be implemented in a database or using any other suitable arrangement. In another embodiment, data store 106 can be stored elsewhere, and data from data store 106 can be retrieved by device 101 when needed for processing and/or presentation to user 100. Data store 106 may store one or more data sets, which may be used for a variety of purposes and may include a wide variety of files, metadata, and/or other data.

In at least one embodiment, data store 106 may store data for performing various tasks and operations in connection with the functionality described herein, including for example creating media stimuli, generating and running AI subjects, recording test results, and/or the like. In at least one embodiment, some or all of such data can be stored at another location, remote from device 101, and device 101 can access such data over a network, via any suitable communications protocol.

In at least one embodiment, data store 106 may be organized in a file system, using well-known storage architectures and data structures, such as relational databases. Examples include Oracle, MySQL, and PostgreSQL. Appropriate indexing can be provided to associate data elements in data store 106 with each other. In at least one embodiment, data store 106 may be implemented using cloud-based storage architectures such as NetApp (available from NetApp, Inc. of Sunnyvale, California) and/or Amazon Simple Storage Service (Amazon S3) (available from Amazon.com of Seattle, Washington).

Data store 106 can be local or remote with respect to the other components of device 101. In at least one embodiment, device 101 is configured to retrieve data from a remote data storage device when needed. Such communication between device 101 and other components can take place wirelessly, by Ethernet connection, via a computing network such as the Internet, via a cellular network, or by any other appropriate communication systems.

In at least one embodiment, data store 106 is detachable in the form of a CD-ROM, DVD, flash drive, USB hard drive, or the like. Information can be entered from a source outside of device 101 into data store 106 that is detachable, and later displayed after data store 106 is connected to device 101. In another embodiment, data store 106 is fixed within device 101.

In at least one embodiment, data store 106 may be organized into one or more well-ordered data sets, with one or more data entries in each set. Data store 106, however, can have any suitable structure. Accordingly, the particular organization of data store 106 need not resemble the form in which information from data store 106 is displayed to user 100 on display screen 103. In at least one embodiment, an identifying label is also stored along with each data entry, to be displayed along with each data entry.

Display screen 103 can be any element that displays information such as text and/or graphical elements. In particular, display screen 103 may present a user interface for entering, viewing, configuring, selecting, editing, downloading, and/or otherwise interacting with data as described herein, including media stimuli, AI subjects, test results, and/or the like. In at least one embodiment where only some of the desired output is presented at a time, a dynamic control, such as a scrolling mechanism, may be available via input device 102 to change which information is currently displayed, and/or to alter the manner in which the information is displayed. In at least one embodiment, display screen 103 can be omitted or functionally combined with one or more other components.

Processor 104 can be a conventional microprocessor for performing operations on data under the direction of software, according to well-known techniques. Memory 105 can be random-access memory, having a structure and architecture as are known in the art, for use by processor 104 in the course of running software.

Communication device 107 may communicate with other computing devices via any known wired and/or wireless protocol(s). For example, communication device 107 may be a network interface card ("NIC") capable of Ethernet communications and/or a wireless networking card capable of communicating wirelessly over any of the 802.11 standards. Communication device 107 may be capable of transmitting and/or receiving signals to transfer data and/or initiate various processes within and/or outside device 101.

Figure 2:
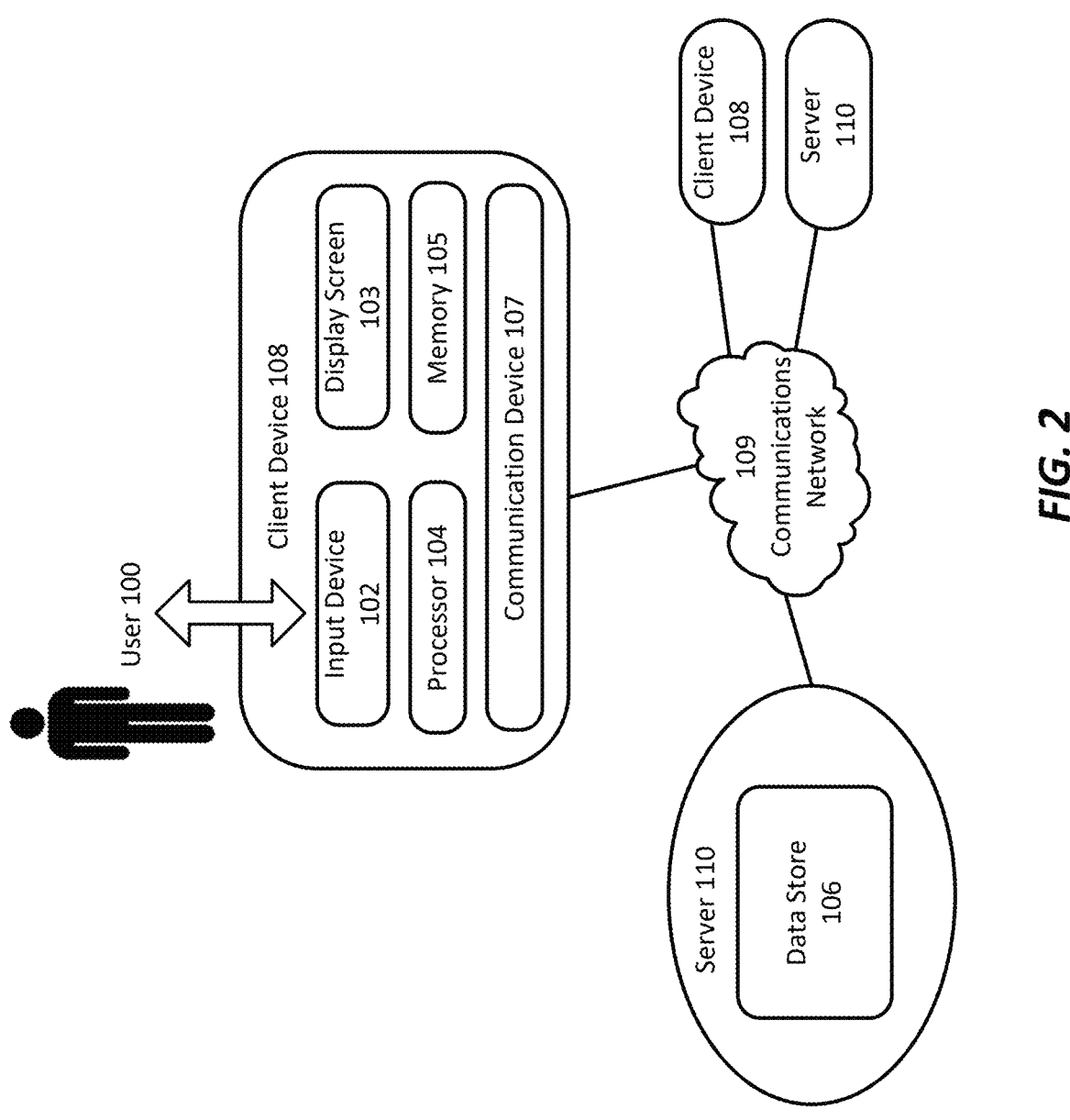
FIG. 2 is a block diagram depicting a hardware architecture for implementing the techniques described herein in a client/server environment, according to one embodiment.

Referring now to FIG. 2, there is shown a block diagram depicting a hardware architecture in a client/server environment, according to one embodiment. Such an implementation may use a "black box" approach, whereby data storage and processing are done completely independently from user input/output. An example of such a client/server environment is a web-based implementation, wherein client device 108 runs a browser that provides a user interface for interacting with web pages and/or other web-based resources from server 110. Items from data store 106 can be presented as part of such web pages and/or other web-based resources, using known protocols and languages such as Hypertext Markup Language (HTML), Java, JavaScript, and the like.

Client device 108 can be any electronic device incorporating input device 102 and/or display screen 103, such as a desktop computer, laptop computer, personal digital assistant (PDA), cellular telephone, smartphone, music player, handheld computer, tablet computer, kiosk, game system, wearable device, or the like. Any suitable type of communications network 109, such as the Internet, can be used as the mechanism for transmitting data between client device 108 and server 110, according to any suitable protocols and techniques. In addition to the Internet, other examples include cellular telephone networks, EDGE, 3G, 4G, 5G, long term evolution (LTE), Session Initiation Protocol (SIP), Short Message Peer-to-Peer protocol (SMPP), SS7, Wi-Fi, Bluetooth, ZigBee, Hypertext Transfer Protocol (HTTP), Secure Hypertext Transfer Protocol (SHTTP), Transmission Control Protocol/Internet Protocol (TCP/IP), and/or the like, and/or any combination thereof. In at least one embodiment, client device 108 transmits requests for data via communications network 109, and receives responses from server 110 containing the requested data. Such requests may be sent via HTTP as remote procedure calls or the like.

In one implementation, server 110 is responsible for data storage and processing, and may incorporate data store 106. Server 110 may include additional components as needed for retrieving data from data store 106 in response to requests from client device 108.

As described above in connection with FIG. 1, data store 106 may be organized into one or more well-ordered data sets, with one or more data entries in each set. Data store 106 can, however, have any suitable structure, and may store data according to any organization system known in the information storage arts, such as databases and other suitable data storage structures.

In addition to or in the alternative to the foregoing, data may also be stored in data store 106 that is part of client device 108. In some embodiments, such data may include elements distributed between server 110 and client device 108 and/or other computing devices in order to facilitate secure and/or effective communication between these computing devices.

As discussed above in connection with FIG. 1, display screen 103 can be any element that displays information such as text and/or graphical elements. Various user interface elements, dynamic controls, and/or the like may be used in connection with display screen 103.

As discussed above in connection with FIG. 1, processor 104 can be a conventional microprocessor for use in an electronic device to perform operations on data under the direction of software, according to well-known techniques. Memory 105 can be random-access memory, having a structure and architecture as are known in the art, for use by processor 104 in the course of running software. Communication device 107 may communicate with other computing devices using any known wired and/or wireless protocol(s), as discussed above in connection with FIG. 1.

In at least one embodiment, some or all of the system can be implemented as software written in any suitable computer programming language, whether in a standalone or client/server architecture. Alternatively, some or all of the system may be implemented and/or embedded in hardware.

Notably, multiple client devices 108 and/or multiple servers 110 may be networked together, and each may have a structure similar to those of client device 108 and server 110 that are illustrated in FIG. 2. The data structures and/or computing instructions used in the performance of methods described herein may be distributed among any number of client devices 108 and/or servers 110. As used herein, "system" may refer to any of the components, or any collection of components, from FIGS. 1 and/or 2, and may include additional components not specifically described in connection with FIGS. 1 and 2.

In some embodiments, data within data store 106 may be distributed among multiple physical servers. Thus, data store 106 may represent one or more physical storage locations, which may communicate with each other via the communications network and/or one or more other networks (not shown). In addition, server 110 as depicted in FIG. 2 may represent one or more physical servers, which may communicate with each other via communications network 109 and/or one or more other networks (not shown). Part of data store 106 may reside on device 101 and/or client device 108.

In one embodiment, some or all components of the system can be implemented in software written in any suitable computer programming language, whether in a standalone or client/server architecture. Alternatively, some or all components may be implemented and/or embedded in hardware.

Figure 13:
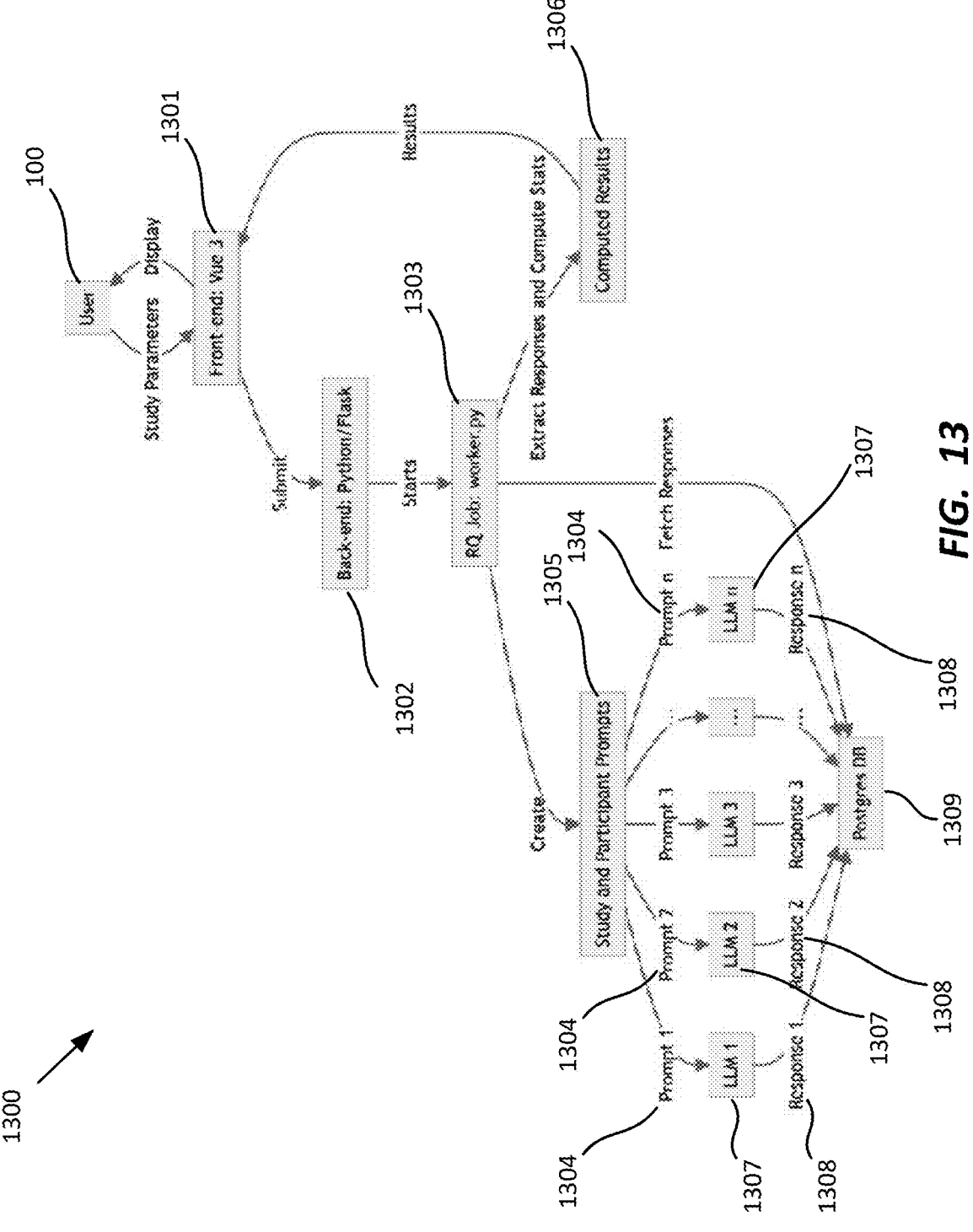
FIG. 13 is a block diagram depicting a software architecture for implementing the techniques described herein according to one embodiment.

Referring now to FIG. 13, there is shown a block diagram depicting an example of software architecture 1300 for implementing the techniques described herein according to one embodiment. In at least one embodiment, software architecture 1300 may be implemented on a hardware architecture such as that shown in FIGS. 1 and/or 2; however, one skilled in the art will recognize that software architecture 1300 can be implemented using other types of hardware.

Front-end 1301, which may be an interactive user interface presented on display screen 103 and accepting input via input device 102, may accept study parameters from user 100 and may display prompts, results, and other visual output for user 100.

Back-end 1302, which may run on processor 104, may receive study parameters collected by front-end 1301, and may initiate job 1303. Job 1303 may create study 1305 along with specified prompts 1304 to be presented to various LLM instances 1307 representing AI subjects. In at least one embodiment, LLM instances 1307 may be distinct instances of a single LLM. Responses received from LLM instances 1307 representing AI subjects may be stored in database 1309, which may be a postgres database stored on data store 106.

Job 1303 may fetch responses from database 1309 and may compute results 1306, which may include statistics from the extracted responses. The results may then be presented to user 100 via front-end 1301.

Figure 14:
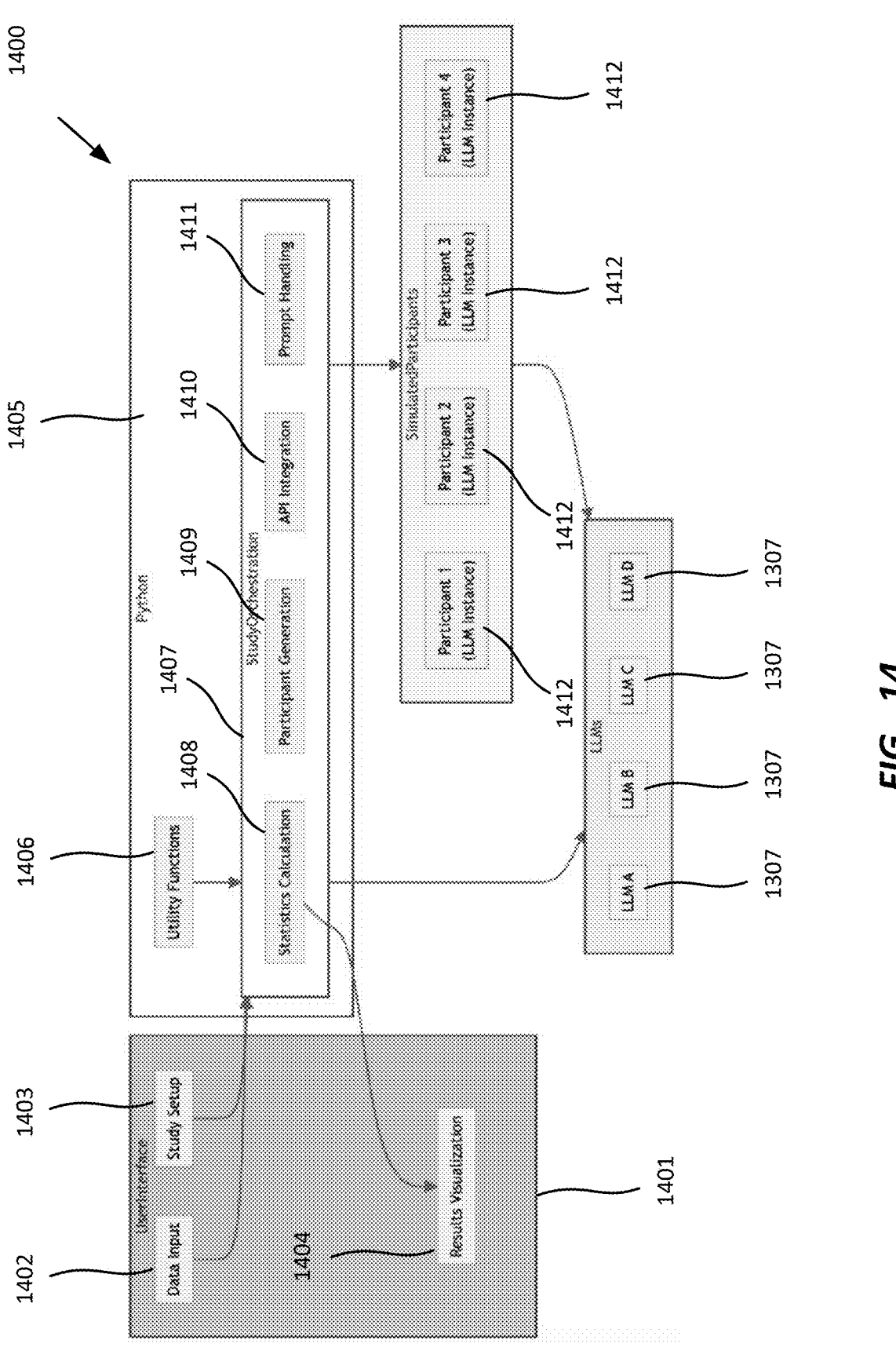
FIG. 14 is a block diagram depicting further details of a software architecture for implementing the techniques described herein according to one embodiment.

Referring now to FIG. 14, there is shown a block diagram depicting further details of a software architecture 1400 for implementing the techniques described herein according to one embodiment.

User interface 1401, which may be implemented by front-end 1301, may accept study setup parameters 1403 and/or other input 1402 from user 100. User interface 1401 may then display prompts, results, and other visual output for user 100, including results visualizations 1404.

Software code 1405, which may run on processor 104, may include study orchestration module 1407 for performing various functions such as statistics calculation 1408, AI subject (participant) generation 1409, API integration 1410, and prompt handling 1411. Statistics calculation 1408 module may generate results, which may then be displayed as results visualizations 1404 via user interface 1401. Software code 1405 may also include various utility functions 1406.

As described in more detail herein, software code 1405 may generate any number of AI subjects (simulated participants) 1412 for interaction with the study. AI subjects 1412 may be implemented, for example, using any number of LLM instances 1307. For example, in at least one embodiment, a separate LLM instance 1307 may implement each AI subject 1412. Each LLM instance 1307 may be a single instance of a particular LLM. In other embodiments, a single LLM instance 1307 may implement multiple AI subjects 1412.

Method

Figure 3:
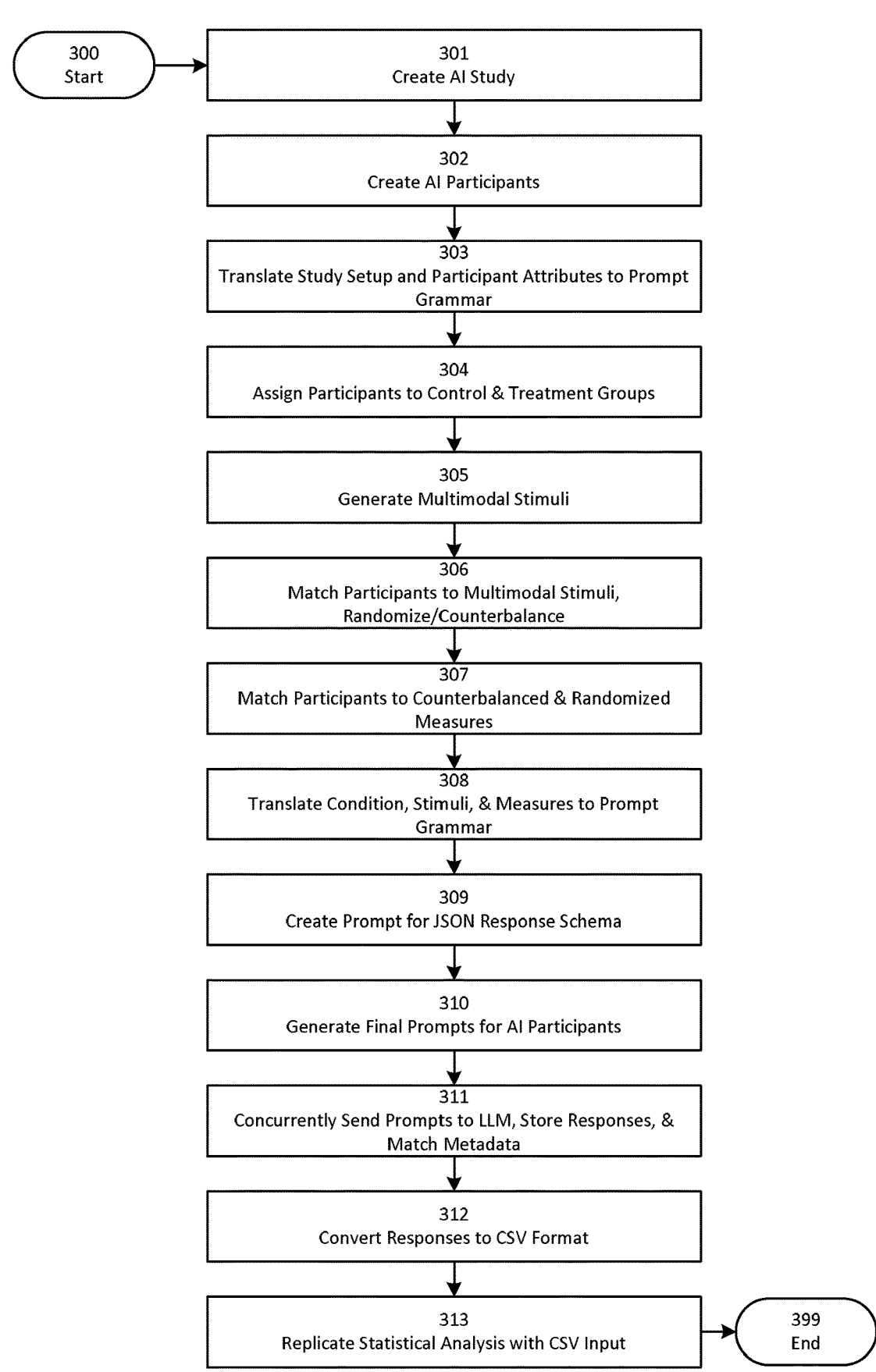
FIG. 3 is a flow diagram depicting an overall method for generating a study, assigning subjects, generating stimuli, matching subjects to stimuli, and processing results, according to one embodiment.

Referring now to FIG. 3, there is shown a flow diagram depicting an overall method for generating a study, assigning subjects, generating stimuli, matching subjects to stimuli, and processing results, according to one embodiment. In at least one embodiment, the method depicted in FIG. 3 may be performed using a hardware architecture as depicted in FIG. 1 and/or FIG. 2. One skilled in the art will recognize that the method may also be performed using other architectures.

The method begins 300. In step 301, an AI study may be created or initialized. It may be entirely new, or it may be based on an existing study. In step 302, any number of AI subjects 1412 may be created, having characteristics that are helpful in analyzing the various stimuli. In at least one embodiment, AI subjects 1412 may represent simulated individuals; however, in other embodiments, they may represent simulated groups such as companies, families, organizations, governments, and/or other entities that may include multiple individuals.

In step 303, study setup and subject attributes may be translated into prompt grammar, using techniques described in more detail herein.

In step 304, AI subjects 1412 may then be assigned to control and treatment groups. In step 305, multimodal stimuli may be generated.

Next, in step 306, the system may match subjects to multimodal stimuli, including randomizing and counterbalancing. In step 307, for each stimulus, the system may then match subjects to one of multiple orders (counterbalanced or randomized) of measures.

In step 308, the system may translate stimuli, conditions (i.e., particular versions of stimuli that will be compared), and measures to the prompt grammar. In step 309, the system may create a prompt for a response schema that may be implemented in JavaScript Object Notation (JSON). Then, in step 310, the system may generate final prompts for AI subjects 1412.

In step 311, the system may concurrently send prompts to the large language models (LLMs) 1307 that implements AI subjects 1412, and store responses. As described in more detail below, matching metadata may also be stored, so that each response can be individually associated with its profile and other characteristics.

In step 312, responses may be converted to CSV format and/or to any other suitable format; for example, in at least one embodiment, responses may be stored in a database on data store 106. Finally, in step 313, statistical analysis may be replicated as desired using the stored information.

The method then ends 399.

Figure 4:
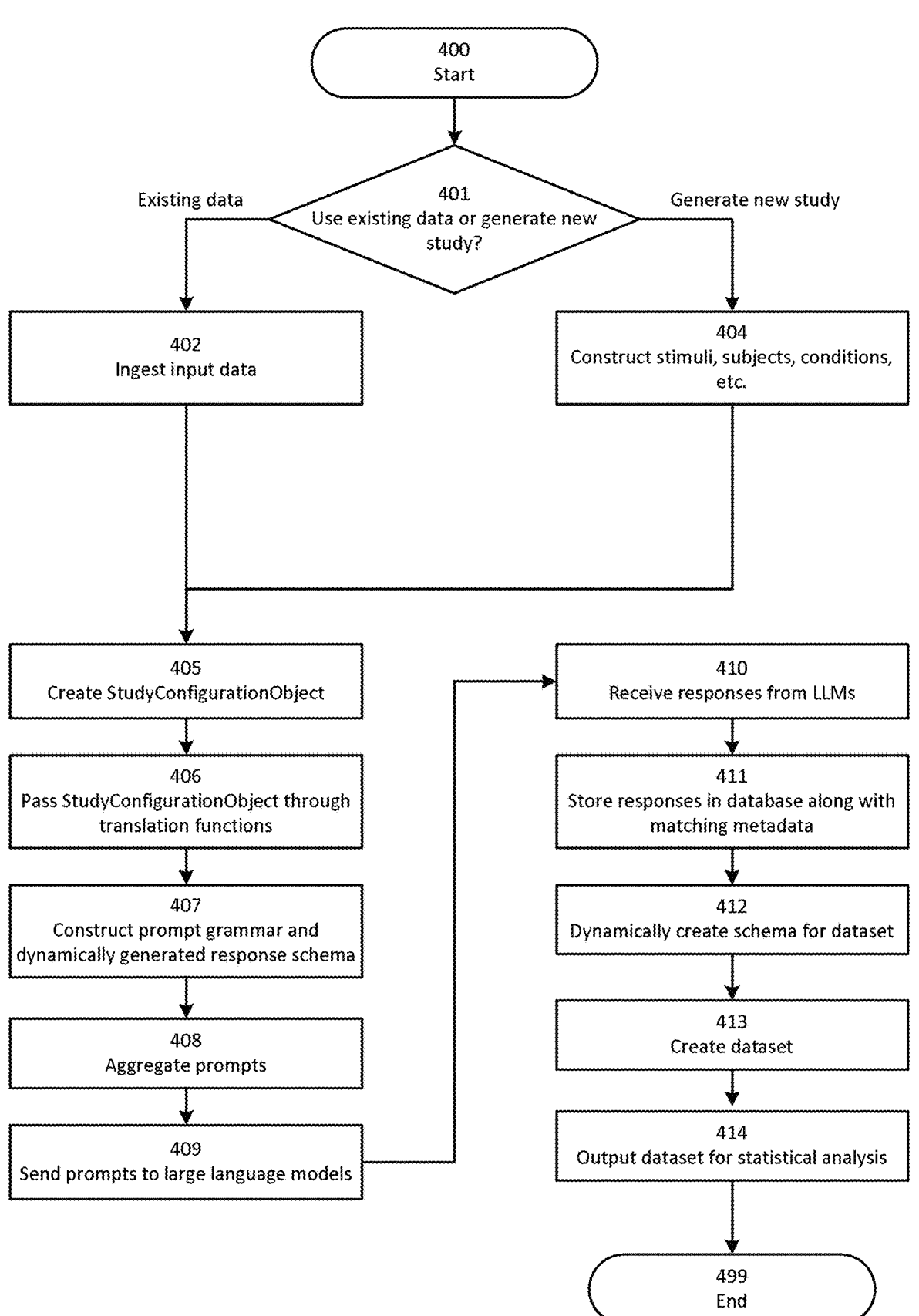
FIG. 4 is a flow diagram depicting a method for generating a study including stimuli, and simulating human responses to such stimuli, according to one embodiment.

Referring now to FIG. 4, there is shown a flow diagram depicting additional details for a method for generating a study including stimuli, and simulating human responses to such stimuli, according to one embodiment. In at least one embodiment, the method depicted in FIG. 4 may be performed using a hardware architecture as depicted in FIG. 1 and/or FIG. 2. One skilled in the art will recognize that the method may also be performed using other architectures.

The method begins 400. In step 401, a determination may be made as to whether existing study data will be used or a new study will be generated. If existing study data will be used, step 402 may be performed, in which input data that is already available may be ingested. Such input data can take any of various forms, including for example research study papers, product logs (interviews, CRM data, usage logs), and/or manual input from users.

If, in step 401, a new study will be generated, step 404 may be performed, in which the system may construct stimuli, AI subjects 1412, conditions, and/or the like, as described in more detail below.

As an example, in step 404, the system may create a study based on a real-time experiment using turn-based chat interaction, wherein low-latency experiments can be performed in the background with AI subjects 1412. A conversation may be facilitated to simulate responses to potential media messages, given a user's message and message history up to a particular point in time. The effect of this simulation is to allow quick experiments to be conducted during an interaction so that responses can be generated, based on the research that the system conducts, in what will seem to human interactants as real time.

In step 405, the system may create a StudyConfigurationObject, by translating research data and/or product logs. The StudyConfigurationObject may be an object representing parameters and characteristics of a study to be run. In at least one embodiment, the StudyConfigurationObject may allow for any or all of the following:

An arbitrary number of simulated humans (also referred to as "AI subjects", "simulated subjects", "virtual personas", "subjects", or "participants"), simulated subject characteristics (e.g., age, gender, political affiliation, number of times going to a fine dining restaurant), and distributions (e.g., 50% male, 4 times a week, and/or the like). This may also include an arbitrary number of simulated subject behaviors (e.g., number of cigarettes smoked last week) and preferences (e.g., prefers hamburgers to salads).

An arbitrary number of simulated and/or actual multimodal stimuli (e.g., text ads, Instagram posts, TikTok videos, product interfaces, and/or the like).

An arbitrary number of measures, which may include questions of interest that each simulated subject should answer (e.g., "How likely are you to buy this product?").

An assignment of simulated subjects, stimuli, and measures to study conditions. For example, subjects with specific profiles (e.g., "Age 29 Female in NYC who goes to fine dining three times a week and is expert in Microsoft Excel, grew up in Canada . . . ") may be assigned to specific stimuli with specific measures.

A schema for outputting individual subject responses into a suitable format for analysis and/or storage in a database in a format that can be directly analyzed with stats libraries.

Figure 5A:
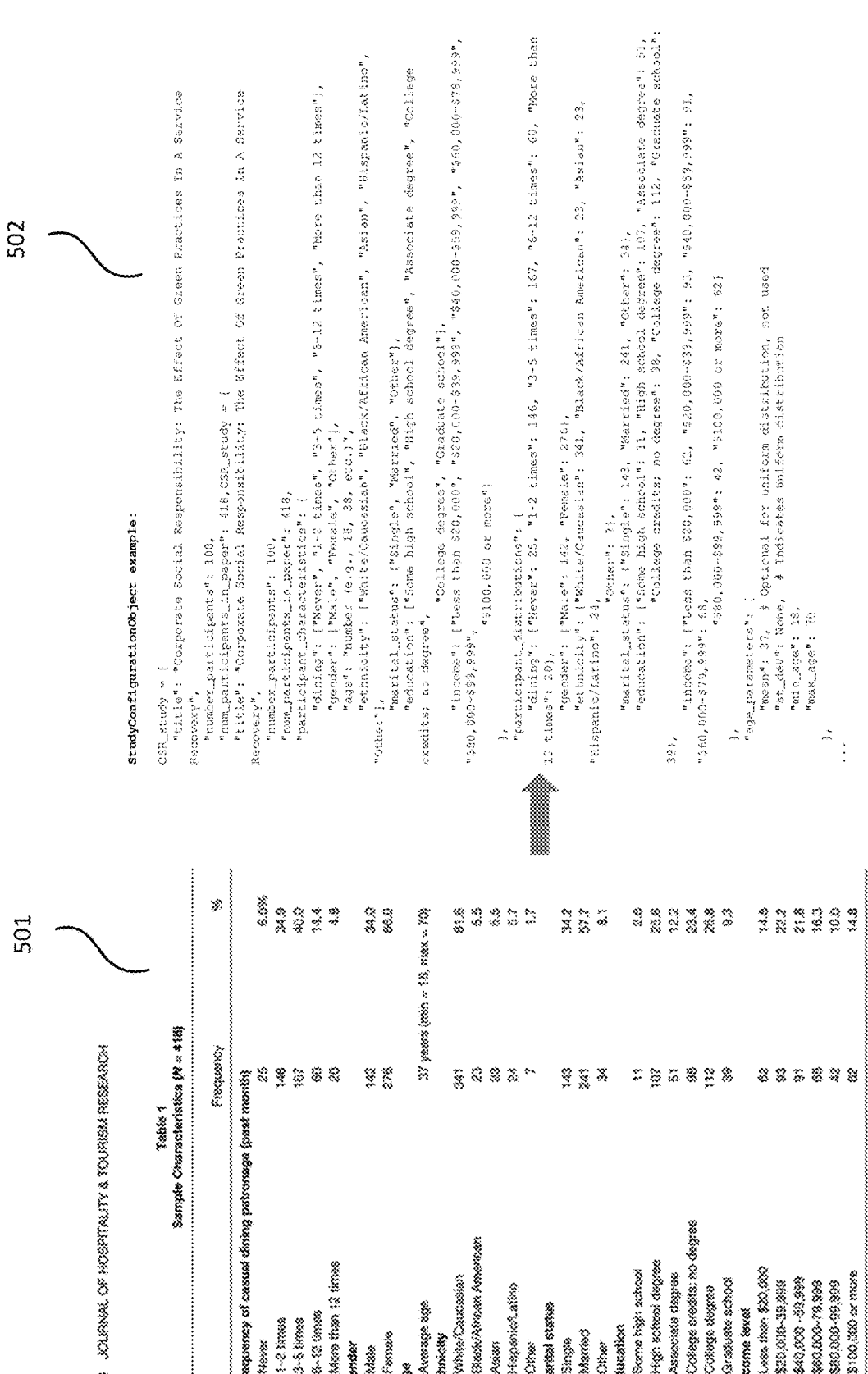

Referring now also to FIGS. 5A, 5B, and 5C, there are shown examples of the creation of a StudyConfigurationObject. In each of the figures, a portion of a research study 501 is translated into StudyConfigurationObject 502.

In steps 406 and 407, the StudyConfigurationObject may be passed through a series of functions that translate documentation (such as research papers, product logs, and/or the like) into prompt grammar parts. An example of such a translation for a subject profile is "You are a 22-year-old female. Your political affiliation is Democrat. You are an undergraduate student at a university in the USA. Now embody these characteristics as a subject in a research study. Deeply immerse yourself in the persona described."

An example of a translation for a stimulus is to encode an image of an Instagram post to base64 and insert it within grammar, as follows: "Please look at the image and read the following text which is meant to accompany it as a caption. Caption: #ad New curated tracks by @DJSCL. Try new #Flow playlist for improved focus while at gym, driving, or coding!"

An example of grammar chunks of measures pertaining to the above stimulus is as follows:

```
"ActualUse": {
"questions": [
"To what degree do you believe the influencer in the
Instagram post actually uses the sponsored product
in everyday life?",
],
"scale": "7-point Likert-type scale (1 = not at all;
7 = very much)"
}
```

Once all prompt grammar parts are constructed and the response schema is generated, in step 408, the prompts may be aggregated. Then, in step 409, each individual prompt may be sent to a single instance of a particular Large Language Model (LLM) 1307. In at least one embodiment, this may take place concurrently for all prompts. By sending each prompt to a different LLM instance 1307, the responses can be tailored to that specific AI subject 1412. For example, they can be uniquely personalized based on the AI subject's 1412 context, background, preferences, study condition, any specific measures, interaction history, and the like. In an alternative embodiment, however, a single LLM instance 1307 may implement multiple AI subjects 1412.

LLM instances 1307 implementing AI subjects 1412 may then process and respond to the prompts. In step 410, responses may be received from the LLM instances 1307. In step 411, the responses may be stored, for example in a database on data store 106, which may be located on device 101 or 108, or on a server 110. In at least one embodiment, as part of step 411, matching metadata may also be stored, so that each response can be individually associated with its profile and other characteristics.

Once the responses have all returned, in step 412, a function may be run that goes through all of the responses and dynamically creates a schema for the dataset. In step 413, a dataset may then be created (for example in a spreadsheet). In step 414, the dataset may be output for further statistical analysis. In at least one embodiment, desired statistics may be directly computed and the results may be output directly.

The method then ends 499.

Creation of AI Subjects

As described above in connection with step 302 of FIG. 3, an arbitrary number of AI subjects 1412 may be created. Any number of subject characteristics can be defined (such as, for example, age, gender, political affiliation, number of times going to a fine dining restaurant, and/or the like) and any number of distributions for such AI subjects may be defined (such as, for example, 50% male, 4 times a week, and/or the like).

The following is an example of pseudocode for the Participant class according to one embodiment:

```
Method ___init___(self, characteristics)
Iterates through characteristics, a dictionary of
attributes.
Dynamically sets each key-value pair in
characteristics as an attribute of the Participant
instance.
Method create_prompt(self)
Initializes a string representation with the
participant's age, formatted as "You are a {age}
year old".
Optionally appends additional participant
information to prompt if available:
```

-continued

---

Ethnicity, Gender, Country of Birth, Income, etc.
Adds a sentence about the participant's preferred
characteristics, e.g. knowledge of AI if available.

---

The following is an example of pseudocode for creating subjects (participants) according to one embodiment:

---

```
Initialize an empty list called participants.
Calculate a scale factor by dividing
number_participants by num_participants_in_paper.
Loop number_participants times to create each
participant:
a. Create an empty dictionary characteristics for
storing participant attributes.
b. Directly assign an age to characteristics using
the generate_age method.
c. For each attribute and its distribution in
participant_distributions:
i. If the distribution is not empty, check if
num_participants_in_paper is not zero and scale the
distribution using scale_participant_distribution;
otherwise, use the original distribution.
ii. Generate the participant attribute using the
possibly scaled distribution and assign it to the
corresponding attribute in characteristics.
d. If participant_random_characteristics is
provided:
i. For each characteristic and its options in
participant_random_characteristics, assign a random
choice of the options to the corresponding
characteristic in characteristics.
e. Create a Participant object with characteristics
and append it to the participants list.
Store the list of Participant objects in
self.participants.
Return the participants list.
```

---

Figure 6:
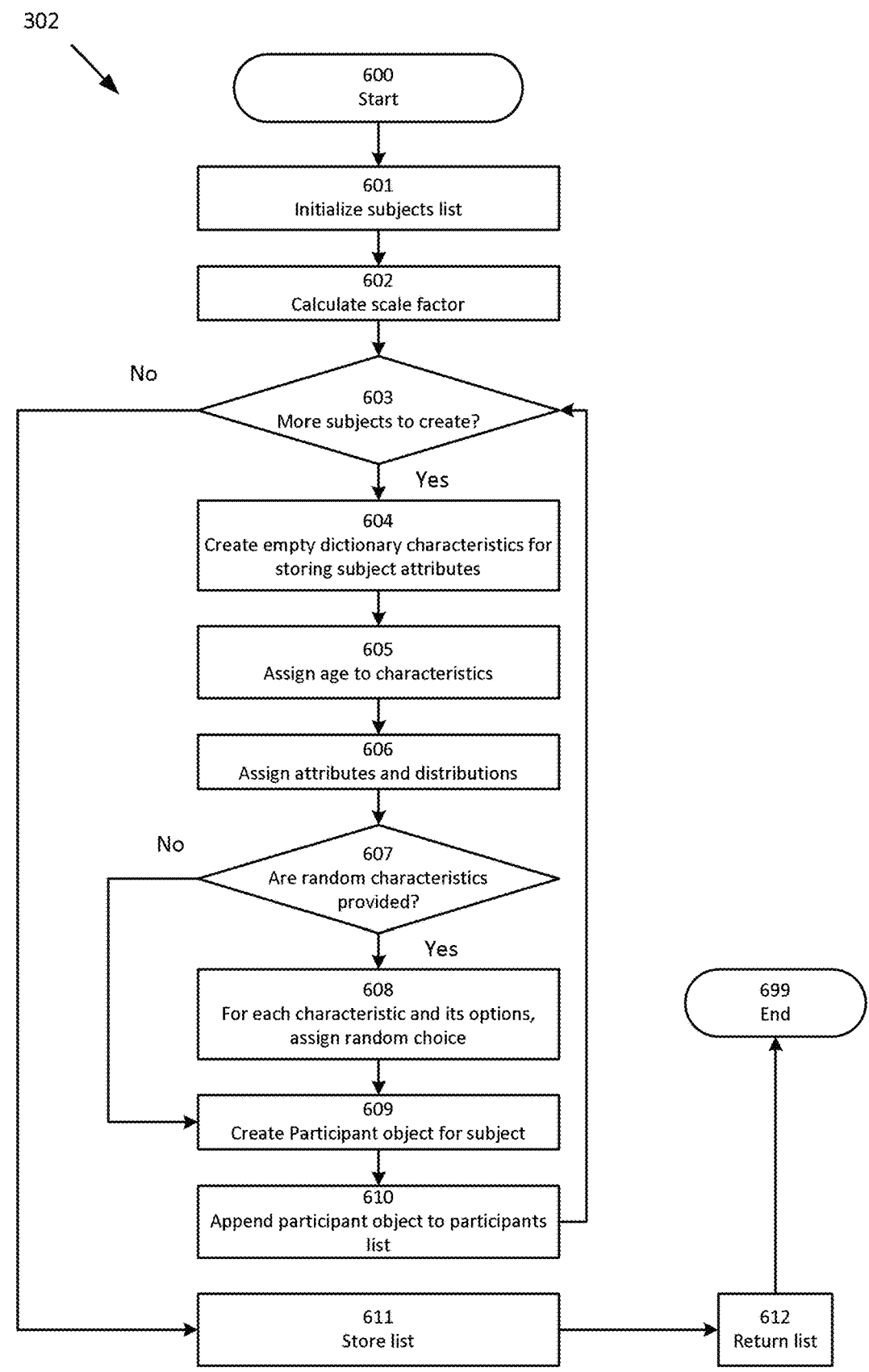
FIG. 6 is a flow diagram depicting a method for creating simulated (AI) subjects according to one embodiment.

Referring now to FIG. 6, there is shown a flow diagram depicting a method for creating simulated (AI) subjects according to one embodiment.

The method begins 600. In step 601, an empty list of subjects (called participants) may be initialized. In step 602, a scale factor may be calculated by dividing number participants by num participants in paper. In step 603, a determination is made as to whether any more subjects are to be added (the loop will be executed number participants times). If so, steps 604 through 610 are performed; otherwise, the method proceeds to step 611.

In step 604, an empty repository called dictionary characteristics may be created for storing subject attributes. In step 605, age may be directly assigned to dictionary characteristics.

In step 606, attributes and distributions may be added. This may be performed by, for each attribute and its distribution in participant distributions, determining if the distribution is not empty. If it is not empty, a check may be made as to whether num participants in paper is not zero; the distribution may then be scaled using scale participant distribution. Otherwise, the original distribution may be used. The subject attribute may then be generated using the distribution (which may or may not be scaled), and may then be assigned to the corresponding attributed in characteristics.

In step 607, a determination is made as to whether random characteristics are provided. If so, step 608 is performed, in which, for each characteristic and its options in participant_random characteristics, a random choice of its options may be assigned to the corresponding characteristic.

In step 609, a participant object may be created using the determined characteristics, and in step 610, the new object may be appended to the participants list. The method then returns to step 603.

In step 611, the list of participant objects may be stored. In step 612, it may be returned.

The method then ends 699.

Creation and Assignment of Simulated Media Messages

As described above in connection with steps 305-307 of FIG. 3, various forms of multimodal stimuli may be generated and matched (assigned) to subjects. These stimuli may include, for example, a number of simulated media messages to which the AI subjects may be exposed. In at least one embodiment, the system may be capable of creating and assigning stimuli, which many include text, images, video, audio, prototypes, mood boards, and/or the like, and/or any combination thereof. stimuli. Other types can be generated in a similar manner.

The following is an example of pseudocode for creating and assigning simulated media messages according to one embodiment:

---

```
Iterate Over Participants: Loop through each
participant in the list to individually assign
stimuli based on their designated condition.
Condition Assignment: Randomly assign a condition to
each participant. This condition determines the
specific stimuli (text or image) the participant
will receive.
Initialize Stimuli Collection: For each participant,
prepare a list to collect their assigned stimuli.
Initialize variables to track text and image
stimuli.
Process Conditions
Stimuli Prepending and Appending: For each item of
stimulus, prepend any required introductory text and
append any concluding text as defined by the study's
requirements.
Finalize Participant Stimuli: Combine all assigned
stimuli into a single, coherent presentation string
for each participant.
```

---

Figure 7:
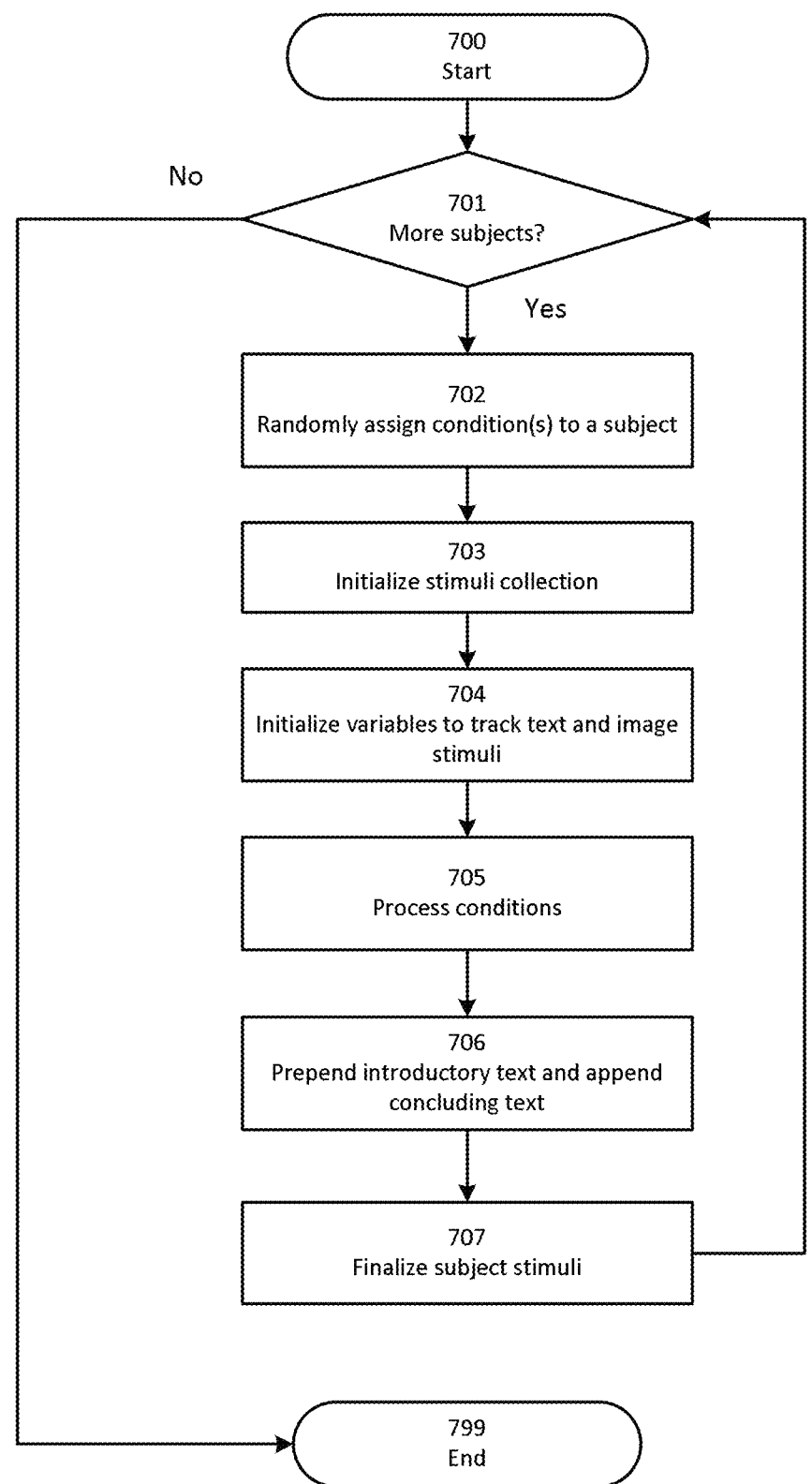
FIG. 7 is a flow diagram depicting a method for creating and assigning stimuli representing simulated media messages according to one embodiment.

Referring now to FIG. 7, there is shown a flow diagram depicting a method for creating and assigning stimuli representing simulated media messages according to one embodiment.

The method begins 700. In step 701, a determination may be made as to whether there are any more AI subjects to which stimuli needs to be assigned. If so, steps 702 through 707 are performed; otherwise, the method ends 799.

For each AI subject, stimuli may be generated and individually assigned based on a designated condition(s) of the subject, as follows. In step 702, one or more condition(s) may be randomly assigned to the subject. Such condition(s) may determine the specific stimuli the subject will receive, which may include text, image(s), and/or any other type of stimuli.

In step 703, a collection of stimuli may be initialized for the subject. This may include, for example, a list for the subject to collect their assigned stimuli. In step 704, variables to track text and image stimuli may be initialized.

In step 705, condition(s) associated with the subject may be processed. In at least one embodiment, this may include the following substeps:

Retrieve Condition Details: For each condition associated with the subject, relevant stimuli details (such as text or image URLs) may be extracted, for example based on a key associated with the condition.

Text Stimuli Assignment: If the condition specifies text stimuli, appropriate text may be selected based on the condition's value. This substep may include, for example:

Looking up a condition value within a predefined stimuli dictionary.

Handling direct matches where the condition directly specifies the stimulus.

Utilizing a fallback message if the specified condition or stimulus cannot be found.

Image Stimuli Assignment: If applicable, a corresponding image URL for the condition may be retrieved.

In at least one embodiment, a structure may be established to allow image paths to be optionally associated with conditions and stored in a separate dictionary. This allows for flexible stimuli handling, since the structure may allow for easy inclusion of other types of stimuli (beyond text and image) by following a similar pattern of condition-based retrieval and assignment.

In step 706, for each item of stimulus, any required introductory text may be prepended, and any concluding text may be appended, as defined by the study's requirements. This step ensures that each stimulus is presented in a contextually appropriate manner.

In step 707, subject stimuli is finalized. In at least one embodiment, this may include combining all assigned stimuli into a single, coherent presentation string for each subject. This may include, for example, combining multiple text stimuli into a paragraph or list, and indicating the image to be viewed.

The described method provides improved extendibility, flexibility, and scalability. New types of stimuli (such as audio clips, videos, or interactive elements) can be integrated by extending the condition and stimuli dictionaries.

Creation of Measures

In at least one embodiment, in step 308, the system generates measures, which are the questions that are asked of the AI subjects, along with the desired scale for responses such as for example, semantic differential, 7-point Likert, and/or the like. Each measure can have any number of questions. The measures generated in step 308 may be based on input collected in steps 402 and/or 404.

The following is an example of pseudocode for creating measures from those defined in the study:

```
Iterate Over Measures: Loop through each measure
defined in the study.
Process Each Measure:
Retrieve Questions and Scale: For each measure,
extract the list of questions and the description of
the scale used for responses.
Randomize Question Order
Personalize Questions:
Conditional Prepending
Track Original and Modified Questions
Flexibility in Question Presentation
```

Figure 8:
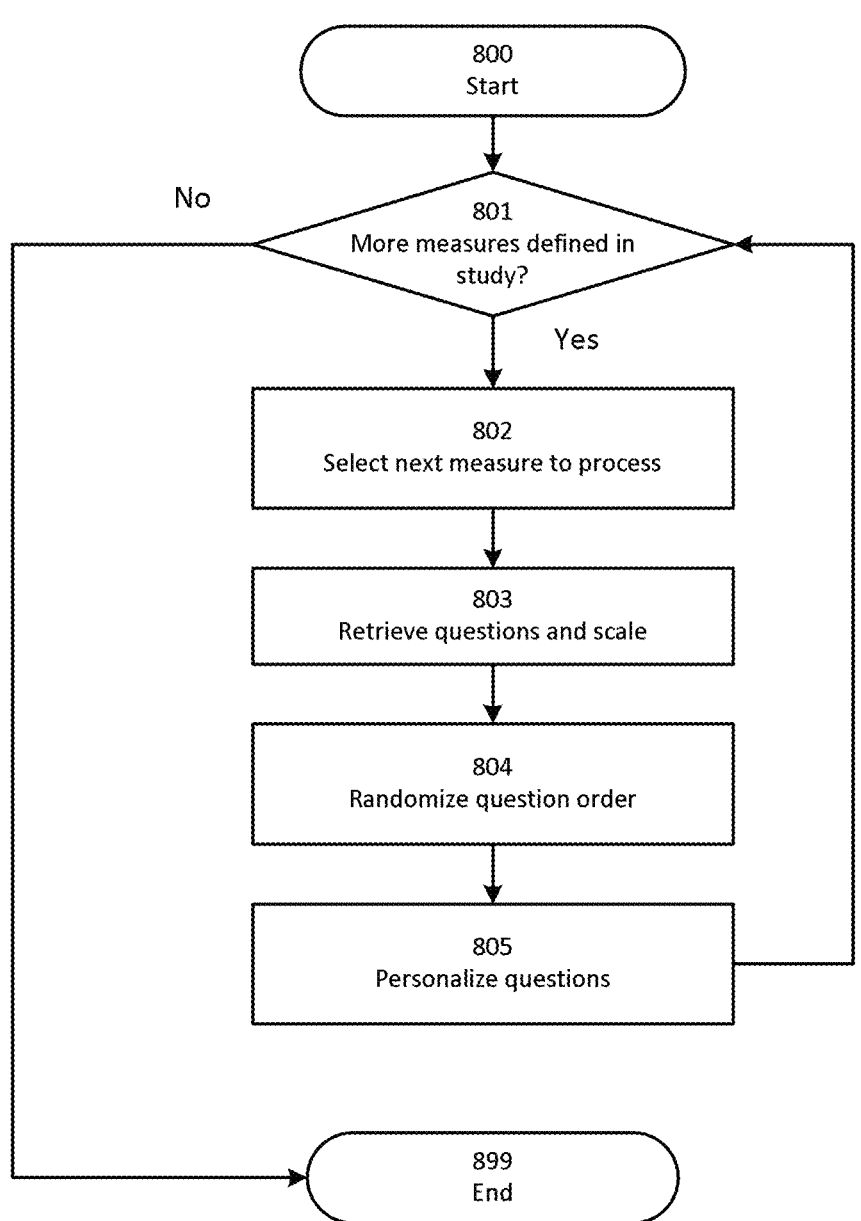
FIG. 8 is a flow diagram depicting a method for creating measures according to one embodiment.

Referring now to FIG. 8, there is shown a flow diagram depicting a method for creating measures according to one embodiment. Measures may be defined by groups of questions aimed at assessing various subject responses, each associated with a specific response scale such as for example, semantic differential, 7-point Likert, and/or the like.

The method begins 800. Each measure defined in the study is processed in turn. In step 801, a determination may be made as to whether there are any more measures defined in the study that are to be processed. If so, steps 802 through 805 are performed; otherwise, the method ends 899.

In step 802, the next measure in the study may be selected for processing.

In step 803, the system may extract a list of questions and the description of the scale used for responses. The scale information contextualizes how responses should be interpreted (for example, by agreement, frequency, quality, and/or the like).

In step 804, the order of questions may be randomized. This may include shuffling the questions within each measure. This step helps to mitigate order bias, where the sequence of questions might influence responses.

In step 805, the questions may be personalized. This may include the following substeps:

Conditional Prepending: For each question, if condition-specific prepend text exists, such as a short introduction or modification based on the subject's assigned condition, the system may replace a placeholder in the question with this text. This step allows for customization of questions based on the subject's condition, making the questions more relevant or specific to the subject's experience.

Track Original and Modified Questions: In at least one embodiment, the system may maintain a mapping of original to modified questions. This may be useful for data analysis, allowing researchers to understand how each question was presented to subjects in the context of their condition.

Flexibility in Question Presentation: In at least one embodiment, mechanisms may be provided for dynamically adjusting question text based on conditions assigned to subjects, thus providing improved adaptability of the survey to provide a tailored experience.

The use of a scale description alongside questions allows different sets of questions to utilize different response formats, offering flexibility in how subject attitudes, beliefs, or behaviors are assessed.

In at least one embodiment, the system can easily accommodate modifications to how questions are presented (for example, by adding new conditions that affect question wording) or the introduction of new scales for response collection. By maintaining a dynamic link between subject conditions and question presentation, the system is well suited to evolving research needs, including the introduction of new measures or the adaptation of existing ones to new study contexts.

Creation of Response Schema

In at least one embodiment, the system creates a response schema, which may be implemented in JavaScript Object Notation (JSON). The AI subjects may be configured to structure their responses in a JSON format to facilitate statistical analysis. One example of such a JSON format is as follows:

```
{"yourResponses": [
    {"question": "This restaurant has a strong
    record of environmentally friendly practices.",
    "yourAnswer": ""}, // 7-point Likert-type scale (1 =
    strongly disagree; 4 = neutral; 7 = strongly agree)
    {"question": "This restaurant supports good
    causes.", "yourAnswer": ""}, // 7-point Likert-type
    scale (1 = strongly disagree; 4 = neutral; 7 =
    strongly agree)
    {"question": "This restaurant behaves
    responsibly regarding the environment.",
```

-continued

```
"yourAnswer": ""}, // 7-point Likert-type scale (1 =
strongly disagree; 4 = neutral; 7 = strongly agree)
  {"question": "In resolving the problem, the
restaurant gave me what I needed.", "yourAnswer":
""}, // 7-point Likert-type scale (1 = strongly
disagree; 4 = neutral; 7 = strongly agree)
  ...
]}
```

By employing such an approach, the system may ensure that each question is encapsulated within an object that includes both the question text and a space for the participant's answer ("yourAnswer": " "). This design simplifies the process of parsing responses for statistical analysis, as each answer is directly associated with its corresponding question.

Any type of scale can be used, including for example: Likert scale, semantic differential, numerical, open-ended sentences, and/or the like.

By structuring responses in a JSON format, the system enforces consistency, which facilitates automated data collection and analysis. This consistency is useful for statistical software and scripts that process and analyze data, enabling efficient aggregation, summary statistics, and inferential statistics applications.

The JSON format also provides flexibility for expansion, by easily accommodating additional questions or modifications to existing ones. New questions can be added as objects within the yourResponses array without altering the overall structure, maintaining compatibility with analysis tools and scripts.

The structure may be optimized for statistical analysis, from basic descriptive statistics to more complex inferential analyses. Analysts can easily extract responses for each question across all participants, enabling comparisons, trend identification, and hypothesis testing regarding perceptions of the restaurant. In addition, the described format provides research flexibility, by supporting diverse research designs, including longitudinal studies where participant attitudes might be tracked over time, and/or comparative studies assessing the impact of interventions (such as, for example, changes in restaurant practices) on customer perceptions. Finally, the described format enables automated data processing; the JSON structure allows for seamless integration into data processing pipelines, enabling automated data cleaning, transformation, and analysis. This efficiency may be particularly beneficial in studies with large datasets, or those for which rapid analysis is necessary.

Generation of Final Prompts

As described in connection with step 310 of FIG. 3, each individual AI subject 1412 may be assigned its own unique ("final") prompt. Metadata may be added, and the process is run so that results can be collected.

Figure 9:
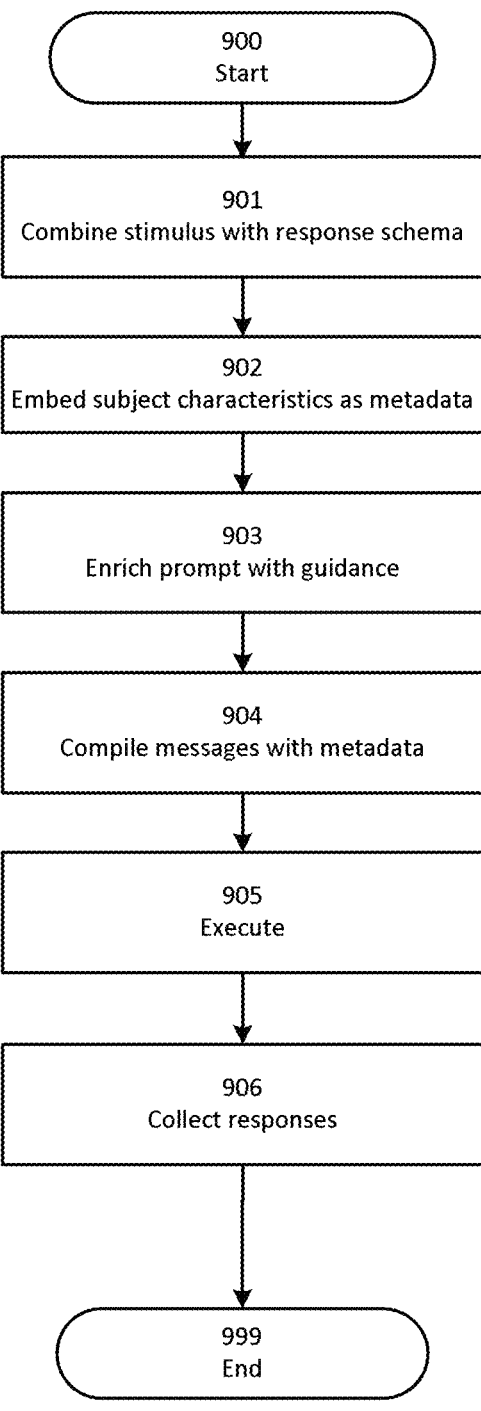
FIG. 9 is a flow diagram depicting a method for generating final prompts and executing the study using AI subjects, according to one embodiment.

Referring now to FIG. 9, there is shown a flow diagram depicting a method for generating final prompts and executing the study using AI subjects, according to one embodiment.

The method begins 900. In step 901, the subject's stimulus prompt may be combined with a response schema, for example by appending the response schema to the subject's stimulus prompt, to construct a final study prompt. The response schema may define how responses should be structured, ensuring consistency across subjects.

In step 902, subject characteristics may be embedded as metadata. This step may include collecting characteristics of each participant, and dynamically assigning the subject's condition(s) to the metadata, enabling detailed tracking of the conditions' effects on responses.

In step 903, the prompt may be enriched with guidance. This step may include appending additional instructions or context (system_message_append) to the initial prompt (participant_prompt), creating a full system prompt. In this manner, AI subject 1412 may be guided as to how to embody the given characteristics during their response, enhancing the relevance and depth of their interaction.

In step 904, messages may be compiled with metadata. Each prompt, enriched with guidance and participant-specific characteristics, may be bundled with its corresponding metadata (including any relevant image URLs) into a structured format. This collection (messages with meta) facilitates easy access to both the prompts used and the detailed context of each interaction.

In step 905, a process may be executed to generate responses. The prepared prompts, now detailed with characteristics and enriched with guidance, may be fed into a process (such as an AI model) to generate responses. This step (self.run_gpt( )) may include running the prompts through a generative model to obtain outputs that reflect the diverse characteristics and conditions of the subjects.

In step 906, responses from the subjects may be collected. As described above in connection with step 413 of FIG. 4, a dataset may be generated for analysis from the collected responses.

Figure 10:
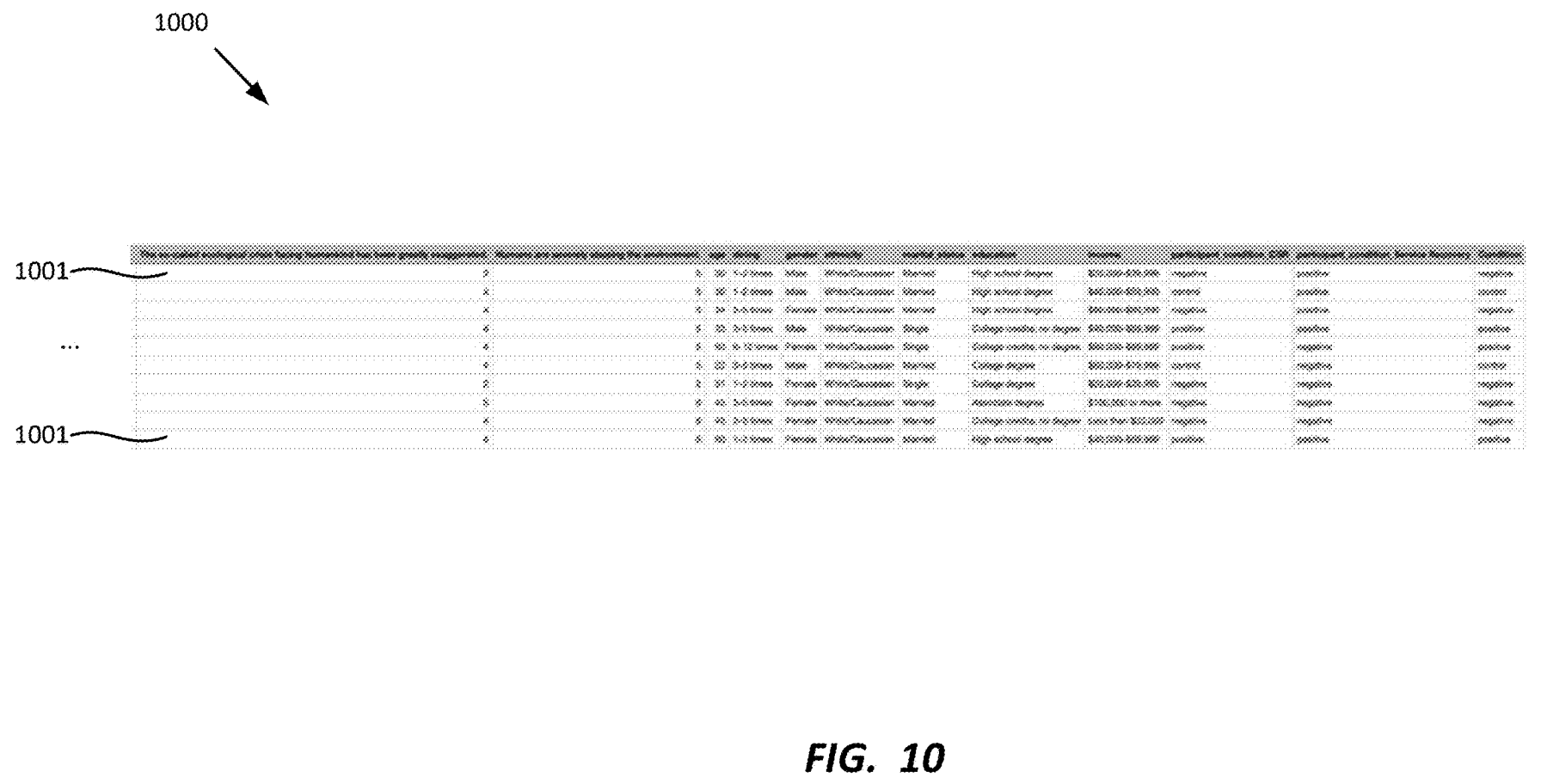

Referring now also to FIG. 10, there is shown an example of a dataset 1000 that may be generated and saved from the collected responses. Each row 1001 in dataset 1000 may represent a response from one AI subject.

The method then ends 999.

Statistical Analysis

In at least one embodiment, once responses have been collected, and a dataset 1000 has been generated and saved, statistical analysis may be performed using construct mappings to evaluate differences between conditions (such as, for example, media messages) based on responses received from the simulated subjects. These results can be integrated into a user-friendly decision-making user interface.

Figure 11:
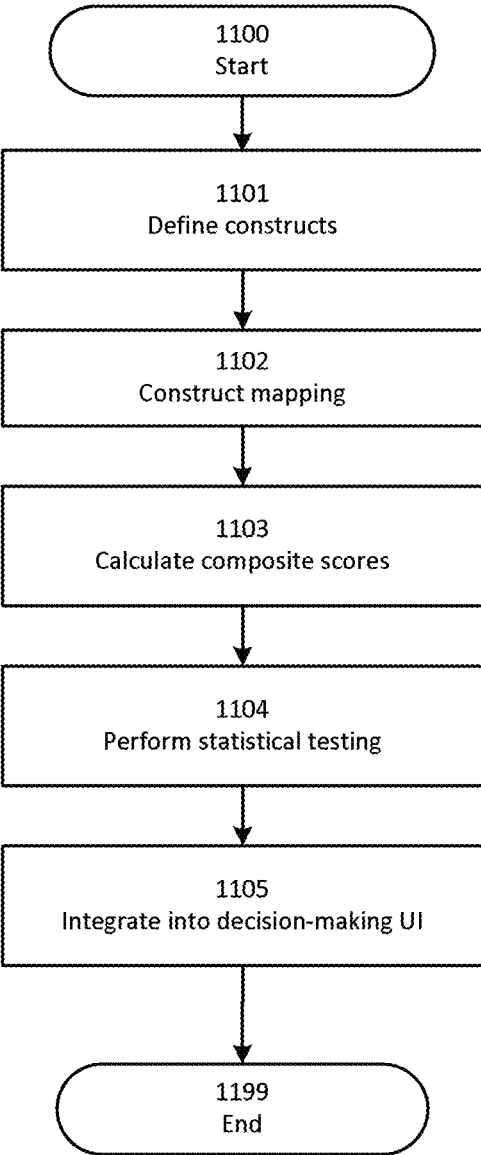
FIG. 11 is a flow diagram depicting a method for performing statistical analysis and integrating results into a decision-making user interface, according to one embodiment.

Referring now to FIG. 11, there is shown a flow diagram depicting a method for performing statistical analysis and integrating results into a decision-making user interface, according to one embodiment.

The method begins 1100. In step 1101, constructs may be defined (such as, for example, prejudiced motivation, purchase likelihood, and/or the like) using original survey question responses. In step 1102, a mapping may be constructed based on the defined constructs. In at least one embodiment, related questions may be grouped to form composite measures that reflect broader concepts or attitudes.

In step 1103, composite scores may be calculated. For each construct, composite scores for subjects may be determined by calculating the mean of responses to the associated questions. This process transforms individual item responses into aggregate scores that represent each construct for further analysis.

In step 1104, statistical testing may be performed. Depending on the research questions and data characteristics, appropriate statistical tests may be applied (such as, for example, t-tests, ANOVA, regression analysis) to compare construct scores across different conditions or groups. In this manner, an assessment may be made as to whether observed differences are statistically significant.

In step 1105, results may be integrated into a decision-making user interface (UI). Results of the statistical tests may be presented in a user-friendly interface that highlights key findings, such as to indicate condition was most effective or whether differences between groups were significant. In at least one embodiment, a decision-making feature may be incorporated that provides clear recommendations based on the test outcomes (for example, proceed with implementing a particular condition or strategy, halt an ineffective campaign, and/or the like). In at least one embodiment, for studies evaluating multiple stimuli, functionality may be included to rank them based on performance, according to the analysis results. This ranking aids in identifying the most effective stimuli for achieving the study's objectives.

The described framework supports not just t-tests but also a range of statistical methods tailored to different types of data and research hypotheses. Tests may be selected to align with the data distribution, the level of measurement, and the study design.

For categorical outcomes, chi-square tests or logistic regression may be appropriate. For continuous outcomes with more than two groups or conditions, ANOVA or multiple regression may be applied.

In at least one embodiment, an interactive dashboard may be provided, which may include any or all of the following features:

Summary Statistics: Descriptive statistics for each construct by condition.

Test Results Section: Clear presentation of statistical test outcomes, highlighting significant differences and offering interpretations in plain language. Data visualizations illustrate and summarize results.

Decision Recommendations: A section that translates test results into actionable recommendations, using a color-coded system (e.g., green for go, red for no-go) to indicate the advisability of each condition.

Stimuli Ranking: A ranked list of stimuli or conditions based on their effectiveness, as determined by the statistical analysis. This may be presented, for example, using bar charts and/or ordered lists.

Tool Tips and Help Sections: Explanatory tool tips and help sections may be included that provide users with information on how to interpret the results and recommendations.

The method then ends 1199.

In at least one embodiment, based on the collected responses from the AI subjects, the system is able to automatically determine which of a number of different available techniques is best suited for generating the statistical report.

An example of raw output that may be generated by the described system is as follows. In at least one embodiment, such output may be presented in a simplified UI or may be immediately incorporated to surface a "winning" media message.

--- t = −17.996, df = 47.017, p-value < 2.2e−16
alternative hypothesis: true difference in means
between group Ad A and group Ad B is not equal to 0
95 percent confidence interval:
−38.89841 −31.07634
sample estimates:
mean in group Ad A          mean in group Ad B
51.94444                    86.93182

---

In at least one embodiment, the system is able to automatically generate an additional stimulus for further research, based on the results of the statistical analysis. For example, if the study involves a comparison of advertisement A with advertisement B, the system is able to generate a statistical report showing which advertisement is more favorably received by various populations of AI subjects. In at least one embodiment, the system may be able to automatically generate an additional stimulus in the form for advertisement C, which may be designed to have even more favorable responses from the relevant population(s), based on the results obtained with respect to advertisements A and B.

User Interface

Referring now to FIGS. 12A through 12K, there are shown examples of various screen shots for a user interface to implement the techniques described herein according to one embodiment.

Figure 12A:
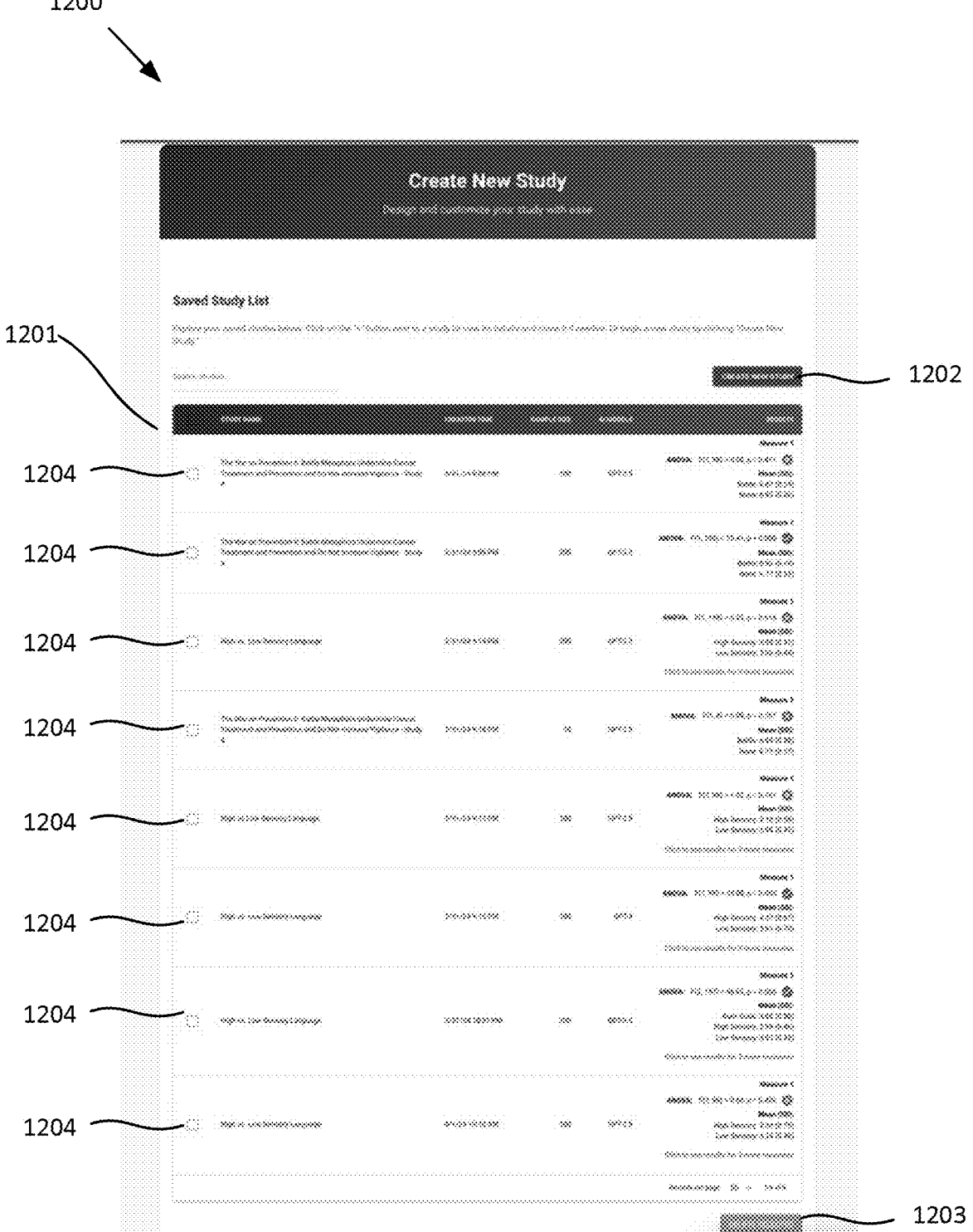
FIGS. 12A through 12K depict examples of various screen shots for a user interface to implement the techniques described herein according to one embodiment.

FIG. 12A depicts screen 1200 for creating a new study. Screen 1200 may include list 1201 of saved studies, each including a checkbox 1204 to enable selection. Button 1202 allows user 100 to create a new study. Button 1203 causes selected studies to be deleted.

Figure 12B:
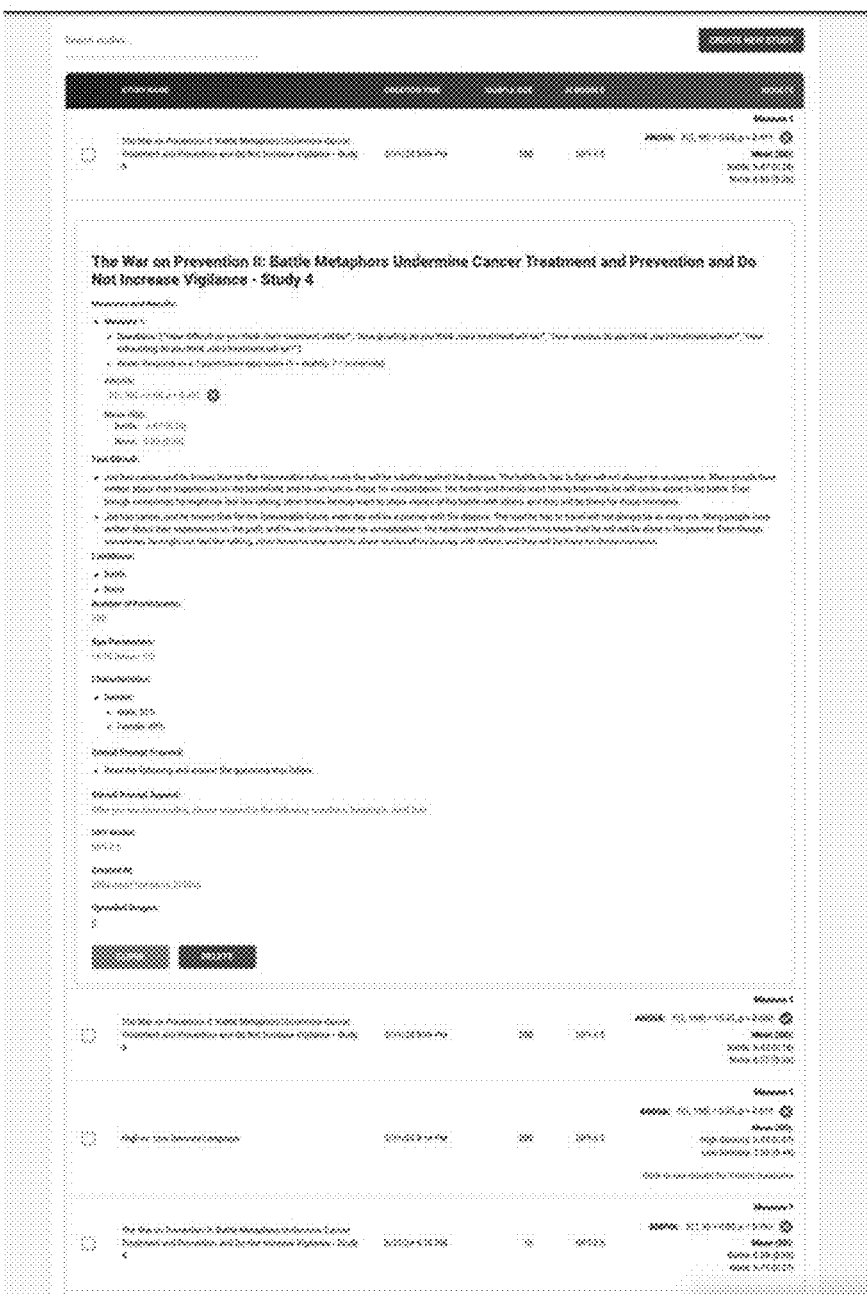

FIG. 12B depicts screen 1205 for displaying particulars of a saved study.

Figure 12C:
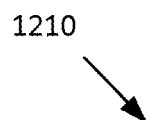

FIG. 12C depicts screen 1210 for creating a simulated study, including designing and customizing the study as desired. User 100 may specify overall study settings in section 1211, may upload stimuli in section 1212, and may upload images in section 1213. In section 1214, user 100 may add text to be used as stimuli in the study.

Figure 12D:
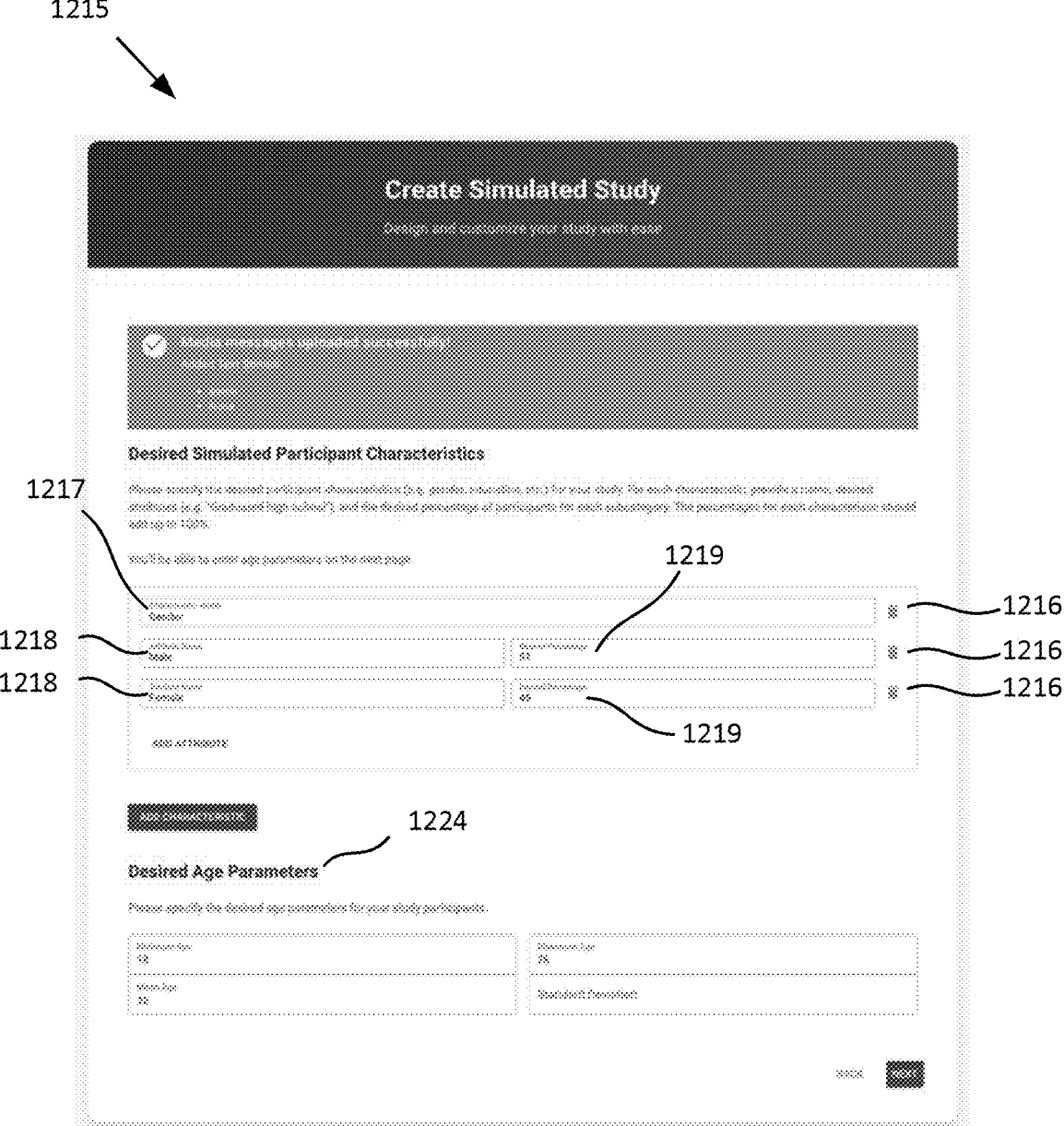

FIG. 12D depicts screen 1215 for continuing to create a simulated study by specifying desired characteristics for simulated subjects (participants). Field 1217 may be used to specify the name of a characteristic. Fields 1218 may be used to specify names of attributes. Fields 1219 may be used to specify a desired percentage for each attribute. Delete buttons 1216 may be used to delete attributes. Section 1224 may be used to specify desired age parameters, including minimum age, maximum age, mean age, and/or standard deviation.

Figure 12E:
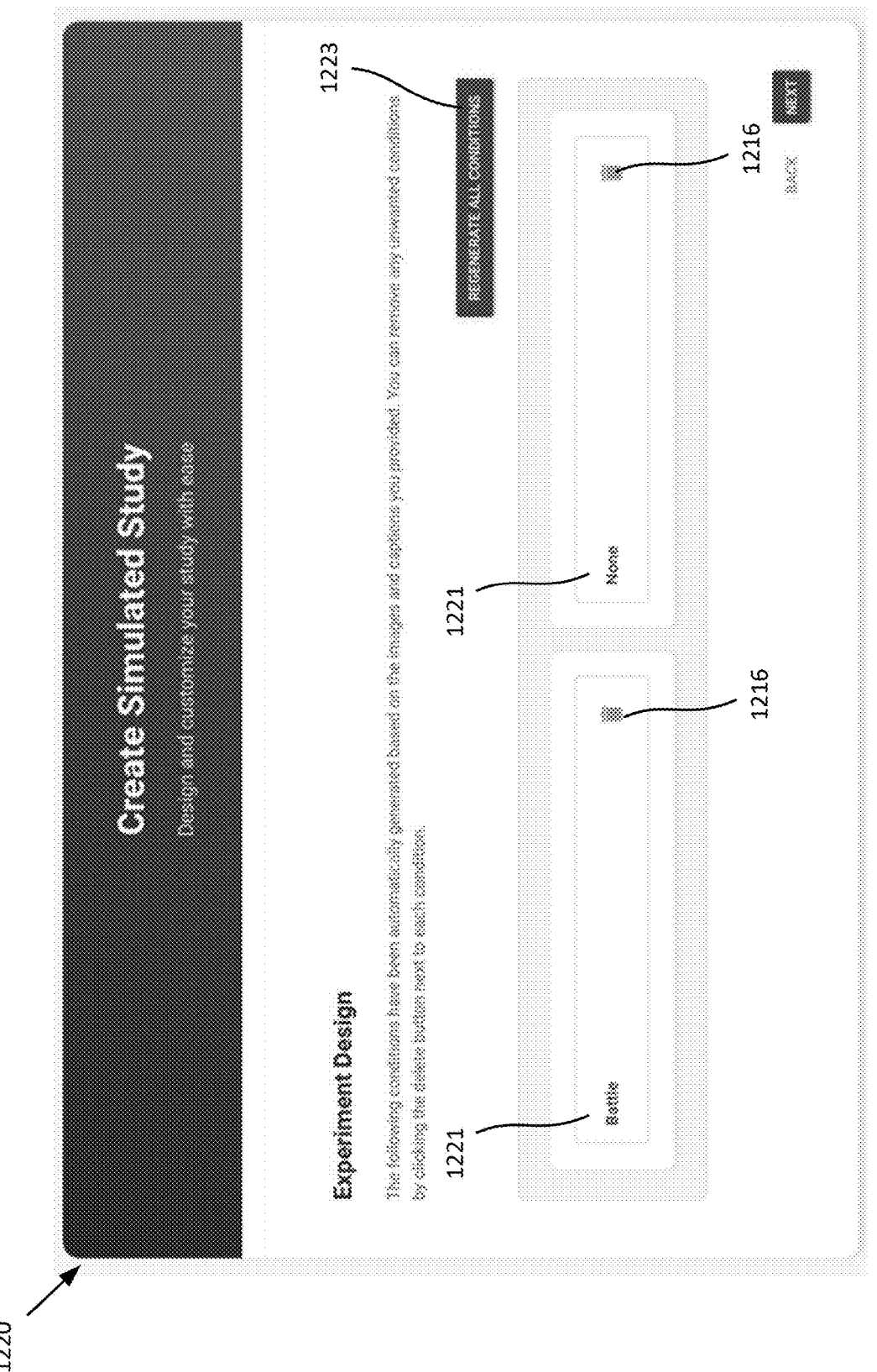

FIG. 12E depicts screen 1220 for continuing to create a simulated study by specifying conditions for an experiment design. Screen 1220 displays various conditions 1221 that have been automatically generated based on the information provided by user 100. User 100 can remove any of the displayed conditions 1221 by clicking on delete buttons 1216. Button 1223 causes all conditions to be regenerated.

Figure 12F:
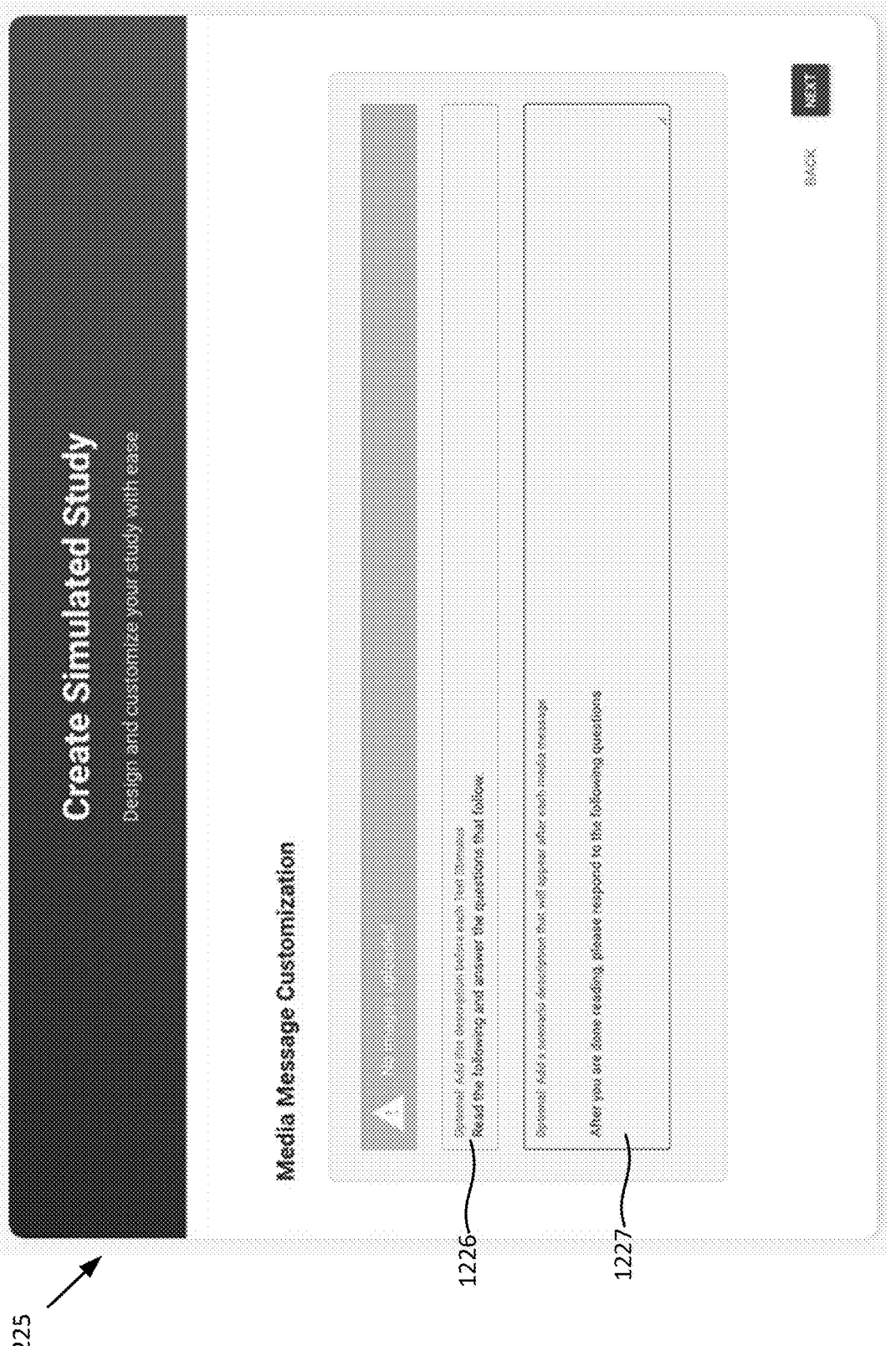

FIG. 12F depicts screen 1225 for continuing to create a simulated study by customizing media message(s). In field 1226, user 100 can provide an optional description to be displayed before each text stimulus. In field 1227, user 100 can provide an optional scenario description to be displayed after each media message.

Figure 12G:
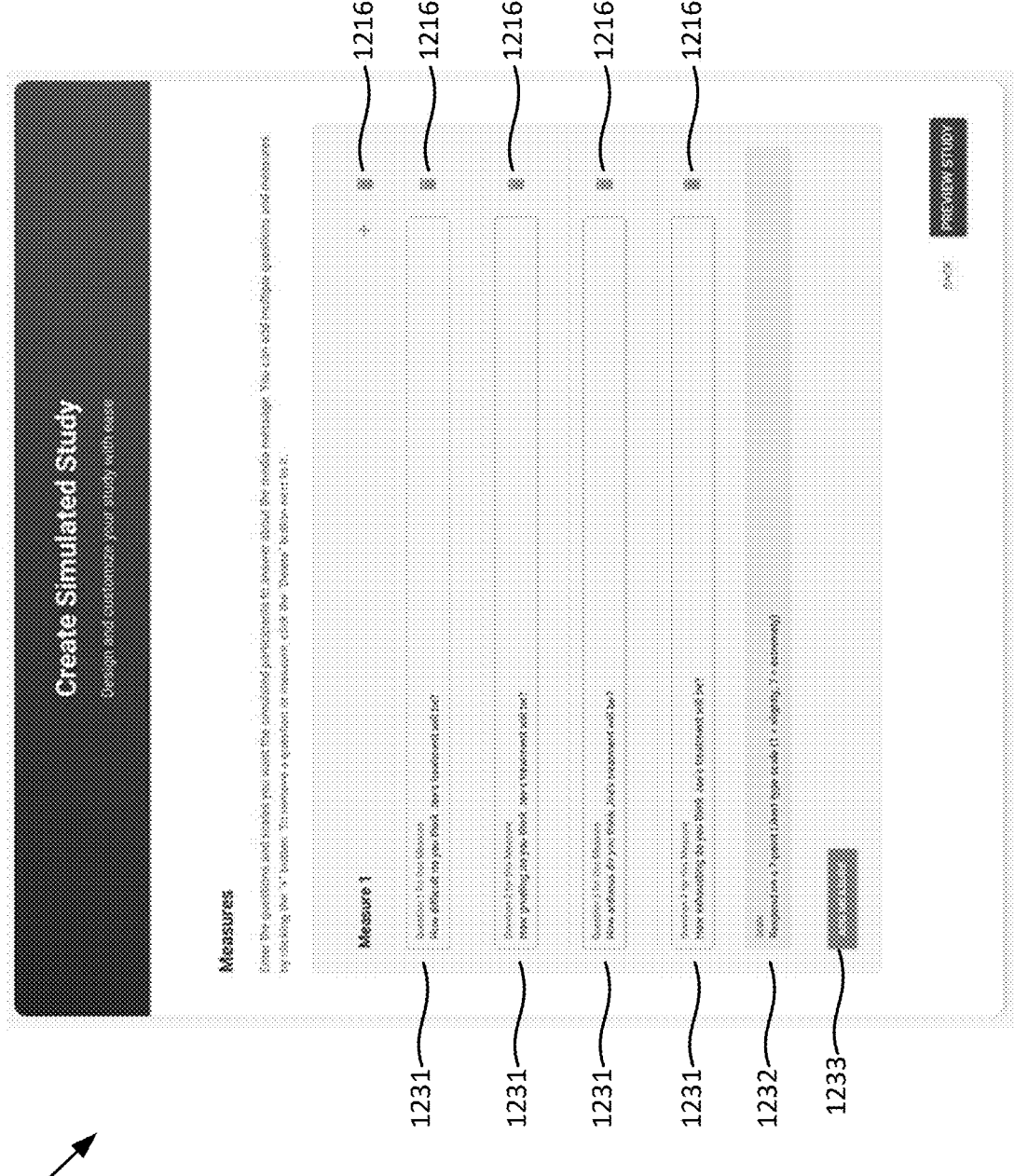

FIG. 12G depicts screen 1230 for continuing to create a simulated study by specifying measure(s). In fields 1231, user 100 can specify question(s) for a measure. In field 1232, user 100 can specify a scale for the measure. User 100 can remove any of the displayed measures by clicking on delete buttons 1216. Button 1233 allows user 100 to add a measure.

Figure 12H:
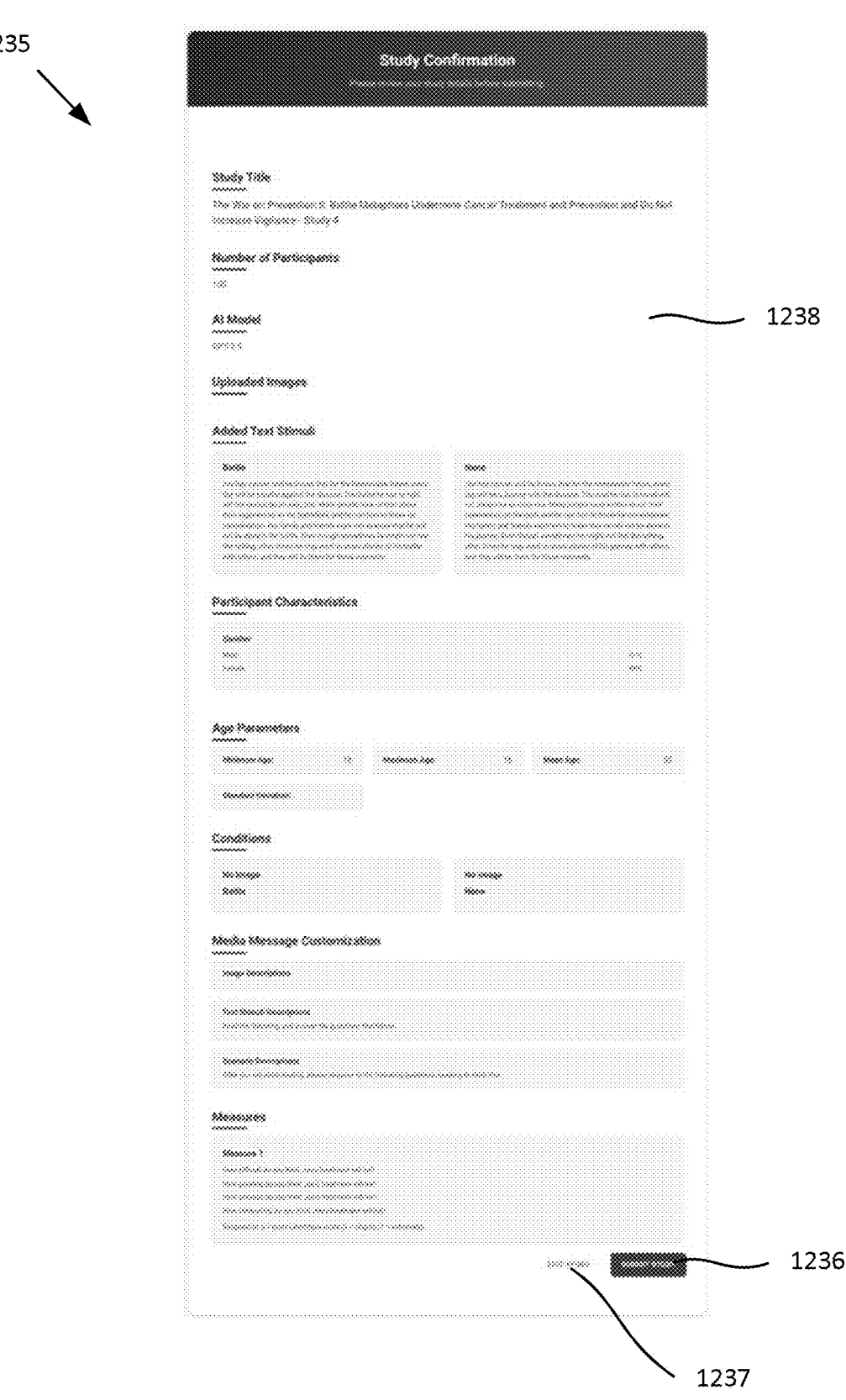

FIG. 12H depicts screen 1235 for confirming the study. Here, user 100 is presented with a summary 1238 of the study to be created. User can click on button 1236 to submit the study, or button 1237 to exit the study without submitting it.

Figure 12I:
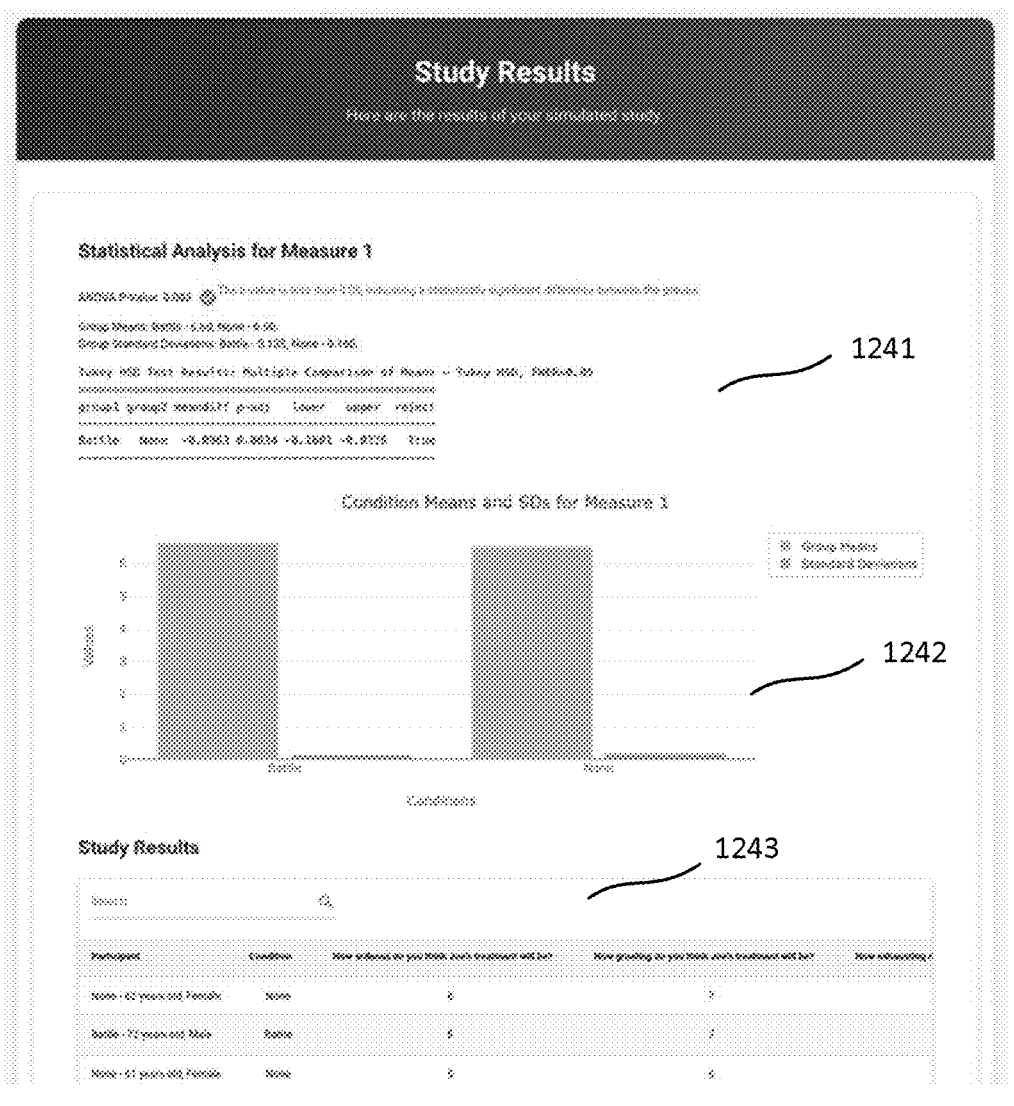
Figure 12J:
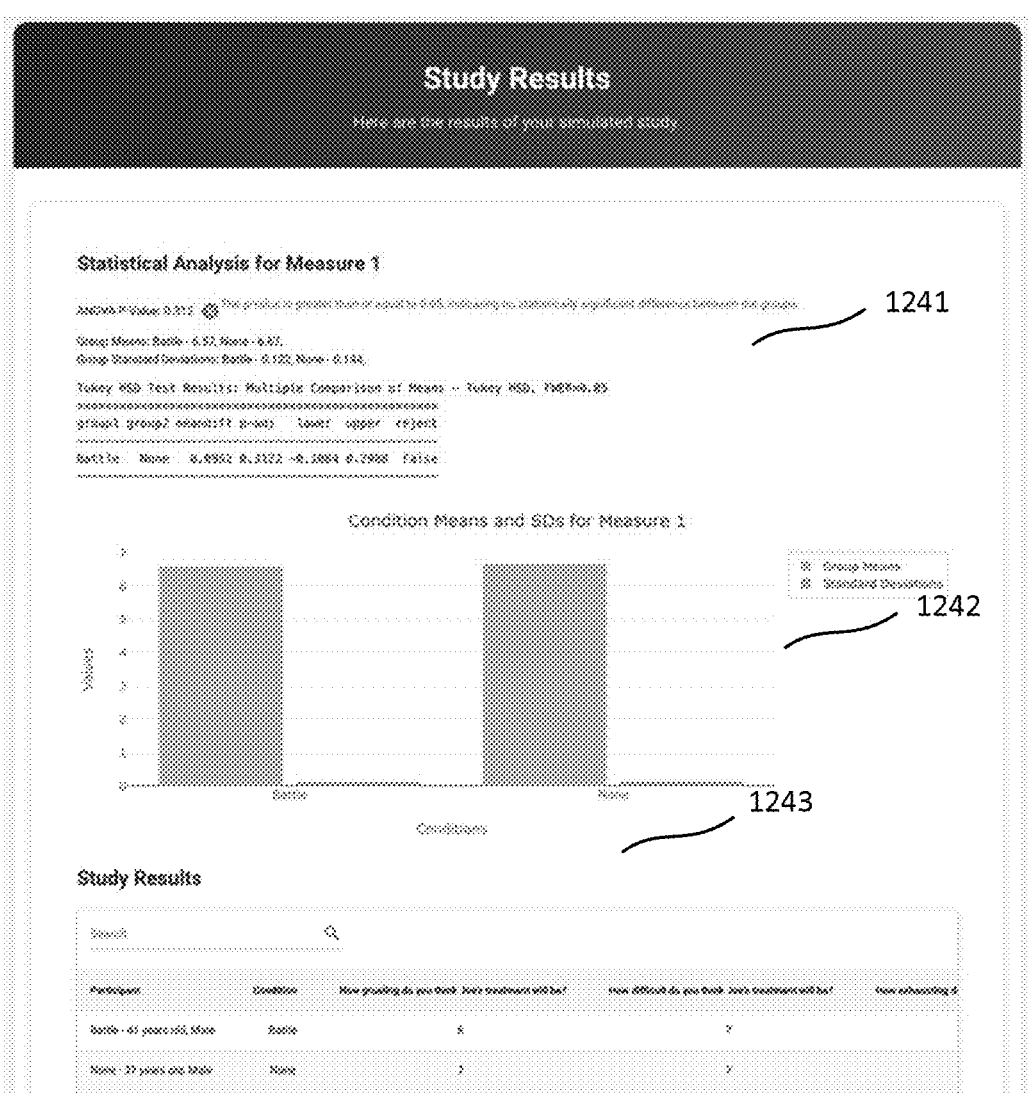

FIGS. 12I and 12J depicts screens 1240A, 1240B for viewing study results. Screen 1240A depicts results indicating a "go" recommendation, and screen 1240B depicts results indicating a "no-go" recommendation. For each result, statistical analysis 1241 is shown, along with graphical results 1242 and detailed study results 1243.

Figure 12K:

FIG. 12K depicts screen 1250 for viewing study results. Prompt 1251 inquires as to how appealing the wine label options 1252 are to AI subjects 1412. Bar graph 1253 shows statistics for overall preference. Table 1254 shows preferences broken down by gender; similar tables can be generated for other subdivisions of AI subjects 1412, such as for example age, frequent vs. rare drinkers, income, geographic location, and/or the like. Error bars on bar graph 1253 indicate a margin of error for the results.

Use Cases

One skilled in the art will recognize that the described techniques can be applied to any of a number of different use cases. Each such use case can be applied using any of a number of different time domains for experiments, such as for example:

Replication experiment, in which AI subjects are used to confirm and extend results in current literature. The techniques described herein may be used to provide more subjects, greater diversity in the sample, and/or a sampling of numerous media stimuli beyond examples in current literature.

Original study, in which AI subjects may be used to complete a new study with a new research question.

Contingency study, in which AI subjects may be used to perform an experiment that produces results that informs the next steps in an interaction as the interaction naturally unfolds. In at least one embodiment, the results may be generated in real-time or near real-time.

The following are examples of use cases for applicability of the techniques described herein.

AI Subjects in Mental Health Research

In an original smartphone intervention study, clinical researchers may wish to test two different strategies for mitigating the adverse effects of social media use on adolescent depression. One strategy monitors total screentime, regardless of the content being used, and another monitors smartphone use only within applications that enable social interactions. In at least one embodiment, the system is able to guide the choice of which strategy would be most effective in reducing depression symptoms. Specifics of the two strategies, which may be implemented in a smartphone app, may include the following:

Screentime App: This intervention cues adolescents to spend less total time on their smartphones by tracking total screentime (regardless of the content of the screen) during one day and sending advisory text messages to users to reduce smartphone use when certain thresholds have been reached.

Content App: This intervention monitors the categories of different applications being used on the smartphone in a single day (e.g., texting, social posting, shopping, browsing) and sends advisory text messages only when use thresholds for social applications are reached.

AI subjects may be sampled according to the protocol described herein, and sample smartphone interactions may be created (using AI) to be used in the experiment. Notably, in such a use case, the described system is able to sample a group of AI subjects, the real world counterpart for which may be extremely difficult to execute, because it is difficult to recruit adolescents for behavioral research. In addition, using conventional mechanisms, it would be difficult and time consuming to obtain complex approvals for use of human subjects; additional challenges exist due to data privacy and security requirements.

In at least one embodiment, the results of the AI experiment, using the prompt code for subject selection and statistical analytics, may guide selection of an appropriate clinical intervention.

In one example, the techniques can be used to test interactions for real-time mental health systems that may use avatars as "chatbots" during interactions. These interactions may engage a single individual (the "patient") in an interaction about their mental health. For example, a chatbot may ask a question about mental health, the patient may respond, and the chatbot may then use that response to formulate the next comment in the interaction. In existing systems, however, the computer code that runs the interactions is generally guided by simple finite-state (if-then) models that do not allow responses to be customized to individual patients; alternatively, such systems may use general knowledge from the literature to create utterances that are targeted at average responses found to be useful in the literature.

The system described herein may provide improved results by anticipating the ability to do fast experiments, conducted within seconds during an interaction, so as to determine the next best utterances to use for the particular patient. This use may be specific to the individual, and the utterances may be developed via experiments conducted in real-time.

For example, a patient may tell the chatbot that they have experienced a traumatic event in the last week, such as the death of a family member. Rather than providing a canned response that is about family trauma, the described system may, in real-time, conduct an experiment to determine the best response for this particular individual, given all that is known up to that point about them, including, for example, demographics, personality, event circumstances, and/or the like. The system may sample appropriate possible responses, create different versions of what might be said, and determine via the prompt construction process an optimal response for this particular individual.

In such an application, the AI sample may be obtained in a number of different ways. For example, the system may sample other similar people for the experiment. Alternatively, if the interaction has already progressed over multiple turns, the sample may be constructed to predict future turns in the interaction for this single individual. Thus, either a cross-sectional sample (involving other similar people) or a longitudinal sample (involving other future time points for one individual) may be used; in yet another embodiment, the two approaches may be combined within in a single AI subject/stimulus design.

Product Design Use for AI Subjects/Stimuli

A typical product design process involves brainstorming multiple examples of product feature choices that are then sifted and winnowed via discussion or, if time allows, recourse to a research literature or single original study that a company designs to test alternatives.

In at least one embodiment, the techniques described herein may be used to enable a design process that conducts AI experiments about product alternatives.

For example, a product team may create several different options for a new brand identity for a home cleaning product. The new branding may include new options for a product name, logo, packaging, and/or advertising strategy. For each of the suggested options in all of the categories, AI experiments may be conducted using the techniques described herein, to allow the various options in each category to compete with one another. For example, different product name choices may be tested via AI with targeted consumers, different drawings of the product packaging options may be created and "shown" to AI subjects, and different sample advertisements for the product may be produced and tested. Using the techniques described herein, the total number of options may be tested, in near real-time, thus avoiding the need to make choices from intuitive discussions or from human subject experiments that may take weeks or months.

Generating AI Subjects for Replication and Extension of Social Scientific Findings Guided by theory as well as practical developments, social scientists regularly examine how the content and structure of media-based stimuli may elicit different levels of cognitive, emotional, or behavioral responses. For example, researchers within the field of health communication may seek to investigate the relative effectiveness of different types of messaging for combatting vaping adoption in teens. Notably, many messaging campaigns have at times relied upon different types of messages, with some highlighting the negative aspects of engaging in risky behaviors, including effects on personal health, emotional distress resultingly experienced by loved ones, consequences for social connection, financial costs, or correlation with other undesirable outcomes (i.e., fear appeals, driving persuasion through psychological reactance). Alternatively, campaigns may create public service announcements or other materials in which the target behavior is promoted within a more positive context, highlighting benefits to health and social standing or prosocial outcomes. In these more positively toned materials, messages will often leverage humor to attract attention and enhance message comprehension, reduce counterarguing, and yield a more favorable attitude about the argument being made.

Often, the literature on the relative effectiveness of these different messaging strategies may yield mixed results, with effects potentially driven by contextual factors, like the particular subjects recruited, the specific behavior targeted, or the various attributes comprising a given stimulus. In at least one embodiment, the system described herein may be used to allow researchers to rapidly iterate and replicate existing studies, and/or generate and run new ones, helping to address concerns about the validity of previous findings. For example, researchers may sample AI subjects using techniques described herein, setting specific subject attributes (such as demographics, psychographics, and/or the like) and the relative distributions for each found within the study to be replicated. The system may process application instances of the specific stimuli used in the previous study and the specific response measures to be collected (such as Likert scale prompts, semantic differentials, open-ended questions, and/or the like). After confirming the exact experimental conditions to be compared and statistics to be computed, the replication study may then be run, using the techniques described herein, thereby obtaining in minutes new responses to different media message stimuli from custom AI subjects based on the original sample, and allowing a more meaningful point of comparison with the previous study.

If desired, the study may then be re-run with slightly altered characteristics of the AI subjects sample, thus avoiding the reliance of convenience sampling of non-representative subjects. Alternative measures may be used to capture target responses. In this capacity, the described system permits the researchers not only to potential replicate past findings but to inspect the generalizability of past findings to different population samples and examine the robustness of findings with respect to triangulated measures.

Generating AI Subjects and Stimuli for Original Research

When conducting studies in which subjects respond to stimuli, researchers must make several decisions, including what people to sample and who should see which stimuli. One important inquiry is to compare relative responses to different types of media messages, such as for example, fear appeals vs. humor appeals in public service announcements, gain frames vs. loss frames in the summary of a ballot resolution, and/or different types of disclaimer messages for debunking misinformation. Also important is the decision of which exact stimuli to show subjects. Unlike A/B testing scenarios in which a design team may be interested in the relative effectiveness of two preordained options, academic researchers often examine effects in light of theory-grounded concepts that are then rendered empirical through sampling of prospective stimuli.

In the case of responses to media stimuli, prospective messages may be selected from existing populations; these may represent many options that vary in terms of the causal variable of interest but also many other confounding attributes. Alternatively, researchers may specially construct custom messages, thereby allowing them to vary solely the causal variable of interest for the study. In either case, using conventional means, researchers may be limited with respect to access, should the ideal stimulus be behind a paywall or restricted to particular use given legal protections.

In at least one embodiment, the described system can be used to assist researchers by generating AI subjects for replication and extension of past work, and also by generating AI stimuli for wholly original research. For example, in the above-described example of examining the relative effectiveness of different anti-vaping messages, researchers who may be interested in conducting a novel study (rather than simply replicating or extending an existing study) may complete the user procedure described above, inputting the desired characteristics and distributions for AI subjects. However, instead of uploading extant stimuli for replication purposes, the researchers may input various parameters to consider for wholly novel stimuli to be generated. Such input may include descriptions of the relative depictions and emotional tone of the message contents, as well as any specific text elements. The described system may then generate a researcher-specified number of stimuli meant to capture the intended message type for each treatment group to be compared. Researchers may then manually select which resulting stimuli they would like to employ in the subsequent study run or, alternatively, have the system pre-test the different options with AI subjects in light of particular responses variables (with respect to presence of the intended target variable and absence of potential confounds).

The described approach to selecting AI generated stimuli may provide significant improvements over conventional pilot testing which, using conventional research practices, is typically costly in terms of time and effort. Regardless of stimulus selection approach, as with the previous example, the researchers may then confirm the statistics to be computed and run the study. In this manner, the researchers may be able to complete stimulus sampling and pre-testing as well as rapid data collection and analysis for an original study.

Advantages

The above-described techniques provide several advantages over known methods for testing human responses to media stimuli. For example:

The described system and method provide the ability to create a prompt grammar for any arbitrary subject characteristics given documentation such as a research paper or product log, and/or for any arbitrary media stimuli characteristics (whether replicated or wholly original), given such documentation.

The described system and method provide the ability to create a prompt grammar for any arbitrary subject measures given documentation such as a research paper or product log.

The described system and method provide the ability to assign subjects to interact with specific or random stimuli and/or measures. In at least one embodiment, experiments may be performed very quickly, and using a specified interactive sequence.

The described system and method provide the ability to generate a quantitative dataset with the subjects' responses to the measures.

The described system and method provide the ability to generate a recommendation for which stimulus to be used, and/or to generate a new stimulus to be used.

The present system and method have been described in particular detail with respect to possible embodiments. Those of skill in the art will appreciate that the system and method may be practiced in other embodiments. First, the particular naming of the components, capitalization of terms, the attributes, data structures, or any other programming or structural aspect is not mandatory or significant, and the mechanisms and/or features may have different names, formats, or protocols. Further, the system may be implemented via a combination of hardware and software, or entirely in hardware elements, or entirely in software elements. In addition, the particular division of functionality between the various system components described herein is merely exemplary, and not mandatory; functions performed by a single system component may instead be performed by multiple components, and functions performed by multiple components may instead be performed by a single component.

Reference in the specification to "one embodiment" or to "an embodiment" means that a particular feature, structure, or characteristic described in connection with the embodiments is included in at least one embodiment. The appearances of the phrases "in one embodiment" or "in at least one embodiment" in various places in the specification are not necessarily all referring to the same embodiment.

Various embodiments may include any number of systems and/or methods for performing the above-described techniques, either singly or in any combination. Another embodiment includes a computer program product comprising a non-transitory computer-readable storage medium and computer program code, encoded on the medium, for causing a processor in a computing device or other electronic device to perform the above-described techniques.

Some portions of the above are presented in terms of algorithms and symbolic representations of operations on data bits within a memory of a computing device. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It may be convenient at times, principally for reasons of common usage, to refer to these signals as bits, values, elements, symbols, characters, terms, numbers, or the like. Furthermore, it may also be convenient at times, to refer to certain arrangements of steps requiring physical manipulations of physical quantities as modules or code devices, without loss of generality.

It should be borne in mind, however, that all of these and similar terms are to be associated with the appropriate physical quantities and are merely convenient labels applied to these quantities. Unless specifically stated otherwise as apparent from the following discussion, it may be appreciated that throughout the description, discussions utilizing terms such as "processing" or "computing" or "calculating" or "displaying" or "determining" or the like, refer to the action and processes of a computer system, or similar electronic computing module and/or device, that manipulates and transforms data represented as physical (electronic) quantities within the computer system memories or registers or other such information storage, transmission or display devices.

Certain aspects include process steps and instructions described herein in the form of an algorithm. It should be noted that the process steps and instructions may be embodied in software, firmware and/or hardware, and when embodied in software, may be downloaded to reside on and be operated from different platforms used by a variety of operating systems.

The present document also relates to an apparatus for performing the operations herein. This apparatus may be specially constructed for the required purposes, or it may comprise a general-purpose computing device selectively activated or reconfigured by a computer program stored in the computing device. Such a computer program may be stored in a computer readable storage medium, such as, but is not limited to, any type of disk including floppy disks, optical disks, CD-ROMs, DVD-ROMs, magnetic-optical disks, read-only memories (ROMs), random access memories (RAMs), EPROMS, EEPROMs, flash memory, solid state drives, magnetic or optical cards, application specific integrated circuits (ASICs), or any type of media suitable for storing electronic instructions, and each coupled to a computer system bus. Further, the computing devices referred to herein may include a single processor or may be architectures employing multiple processor designs for increased computing capability.

The algorithms and displays presented herein are not inherently related to any particular computing device, virtualized system, or other apparatus. Various general-purpose systems may also be used with programs in accordance with the teachings herein, or it may prove convenient to construct more specialized apparatus to perform the required method steps. The required structure for a variety of these systems will be apparent from the description provided herein. In addition, the system and method are not described with reference to any particular programming language. It will be appreciated that a variety of programming languages may be used to implement the teachings described herein, and any references above to specific languages are provided for disclosure of enablement and best mode.

Accordingly, various embodiments include software, hardware, and/or other elements for controlling a computer system, computing device, or other electronic device, or any combination or plurality thereof. Such an electronic device may include, for example, a processor, an input device (such as a keyboard, mouse, touchpad, track pad, joystick, trackball, microphone, and/or any combination thereof), an output device (such as a screen, speaker, and/or the like), memory, long-term storage (such as magnetic storage, optical storage, and/or the like), and/or network connectivity, according to techniques that are well known in the art. Such an electronic device may be portable or non-portable. Examples of electronic devices that may be used for implementing the described system and method include: a mobile phone, personal digital assistant, smartphone, kiosk, server computer, enterprise computing device, desktop computer, laptop computer, tablet computer, consumer electronic device, or the like. An electronic device may use any operating system such as, for example and without limitation: Linux; Microsoft Windows, available from Microsoft Corporation of Redmond, Washington; MacOS, available from Apple Inc. of Cupertino, California; iOS, available from Apple Inc. of Cupertino, California; Android, available from Google, Inc. of Mountain View, California; and/or any other operating system that may be adapted for use on the device.

While a limited number of embodiments have been described herein, those skilled in the art, having benefit of the above description, will appreciate that other embodiments may be devised. In addition, it should be noted that the language used in the specification has been principally selected for readability and instructional purposes, and may not have been selected to delineate or circumscribe the subject matter. Accordingly, the disclosure is intended to be illustrative, but not limiting, of scope.

What is claimed is:

1. A computer-implemented method for simulating responses to media stimuli in order to compare effectiveness of different versions of the media, comprising:
   at an input device, receiving a study configuration object comprising a first set of parameters defining a demographic distribution for artificial intelligence (AI) subjects to be run on at least one hardware processor to simulate human subjects and a second set of parameters defining a plurality of experimental conditions;
   at the at least one hardware processor, programmatically translating the study configuration object into a prompt grammar;
   at the at least one hardware processor, generating a plurality of AI subjects by executing the prompt grammar on at least one large language model, wherein each AI subject is instantiated with specific characteristics based on the demographic distribution;
   at a storage device, storing data defining the plurality of AI subjects;
   at the at least one hardware processor, assigning each generated AI subject to either a control group or a treatment group defined by the experimental conditions;
   at the at least one hardware processor, generating stimuli corresponding to the assigned experimental condition for each AI subject, the stimuli representing at least one version of the media;
   at the at least one hardware processor, constructing a final prompt for each AI subject comprising the specific characteristics, the generated stimuli, and a response schema defining a required structured output format;
   at the at least one hardware processor, presenting the final prompt to each AI subject, to expose each AI subject to a version of the media;
   at the at least one hardware processor, recording responses from the AI subjects at the at least one hardware processor, automatically comparing effectiveness of the different versions of the media;
   at an output device, outputting a statistical analysis report based on the recorded responses and the comparison; and
   at the storage device, storing the recorded responses.

2. The method of claim 1, wherein the stimuli comprises at least one selected from the group consisting of:
   text;
   a question;
   at least one image; and
   video content.

3. The method of claim 1, wherein:
   each final prompt has a type;
   each AI subject is implemented as a large language model instance; and
   each large language model instance is adapted to automatically detect the type of each prompt.

4. The method of claim 1, wherein:
   comparing the effectiveness of the different versions of the media comprises, at the at least one hardware processor, running a statistical analysis of the recorded responses of the generated AI subjects to the stimuli; and
   the statistical analysis report is based on the statistical analysis.

5. The method of claim 4, wherein running the statistical analysis comprises automatically determining which of a plurality of techniques to use for the statistical analysis.

6. The method of claim 4, further comprising automatically generating additional stimulus for further research, based on the results of the statistical analysis.

7. The method of claim 1, wherein comparing the effectiveness of the different versions comprises computing composite scores from the recorded structured responses using construct mappings, and performing statistical testing on the composite scores across the control group and the treatment group.

8. A non-transitory computer-readable medium for simulating responses to media stimuli in order to compare effectiveness of different versions of the media, comprising instructions stored thereon, that when performed by at least one hardware processor, perform the steps of:
   causing an input device to receive a study configuration object comprising a first set of parameters defining a demographic distribution for artificial intelligence (AI) subjects to be run on at least one hardware processor to simulate human subjects and a second set of parameters defining a plurality of experimental conditions;
   programmatically translating the study configuration object into a prompt grammar;
   generating a plurality of AI subjects by executing the prompt grammar on at least one large language model, wherein each AI subject is instantiated with specific characteristics based on the demographic distribution;
   causing a storage device to store data defining the plurality of AI subjects;
   assigning each generated AI subject to either a control group or a treatment group defined by the experimental conditions;
   generating stimuli corresponding to the assigned experimental condition for each AI subject, the stimuli representing at least one version of the media;

constructing a final prompt for each AI subject comprising the specific characteristics, the generated stimuli, and a response schema defining a required structured output format;

presenting the final prompt to each AI subject, to expose each AI subject to a version of the media;

recording responses from the AI subjects;

automatically comparing effectiveness of the different versions of the media;

causing an output device to output a statistical analysis report based on the recorded responses and the comparison; and causing the storage device to store the recorded responses.

9. The non-transitory computer-readable medium of claim 8, wherein the stimuli comprises at least one selected from the group consisting of:

text;

a question;

at least one image; and video content.

10. The non-transitory computer-readable medium of claim 8, wherein:

each final prompt has a type;

each AI subject is implemented as a large language model instance; and each large language model instance is adapted to automatically detect the type of each prompt.

11. The non-transitory computer-readable medium of claim 8, wherein:

comparing the effectiveness of the different versions of the media comprises, at the at least one hardware processor, running a statistical analysis of the recorded responses of the generated AI subjects to the stimuli; and the statistical analysis report is based on the statistical analysis.

12. The non-transitory computer-readable medium of claim 11, wherein running the statistical analysis comprises automatically determining which of a plurality of techniques to use for the statistical analysis.

13. The non-transitory computer-readable medium of claim 11, further comprising instructions stored thereon, that when performed by the hardware processor, perform the step of automatically generating additional stimulus for further research, based on the results of the statistical analysis.

14. The non-transitory computer-readable medium of claim 8, wherein comparing the effectiveness of the different versions comprises computing composite scores from the recorded structured responses using construct mappings, and performing statistical testing on the composite scores across the control group and the treatment group.

15. A system for simulating responses to media stimuli in order to compare effectiveness of different versions of the media, comprising:

an input device, configured to receive a study configuration object comprising a first set of parameters defining a demographic distribution for artificial intelligence (AI) subjects to be run on at least one hardware processor to simulate human subjects and a second set of parameters defining a plurality of experimental conditions;

at least one hardware processor, each communicatively coupled to the input device, configured to;

programmatically translate the study configuration object into a prompt grammar; and generate a plurality of AI subjects by executing the prompt grammar on at least one large language model, wherein each AI subject is instantiated with specific characteristics based on the demographic distribution;

a storage device, communicatively coupled to the at least one hardware processor, configured to store data defining the plurality of AI subjects; and an output device, communicatively coupled to the at least one hardware processor;

wherein:

the at least one hardware processor is further configured to:

assign each generated AI subject to either a control group or a treatment group defined by the experimental conditions;

generate stimuli corresponding to the assigned experimental condition for each AI subject, the stimuli representing at least one version of the media;

construct a final prompt for each AI subject comprising the specific characteristics, the generated stimuli, and a response schema defining a required structured output format;

present the final prompt to each AI subject, to expose each AI subject to a version of the media;

record responses from the AI subjects; and automatically compare effectiveness of the different versions of the media;

the an output device is configured to output a statistical analysis report based on the recorded responses and the comparison; and the storage device is further configured to store the recorded responses.

16. The system of claim 15, wherein the stimuli comprises at least one selected from the group consisting of:

text;

a question;

at least one image; and video content.

17. The system of claim 15, wherein:

each final prompt has a type;

each AI subject is implemented as a large language model instance; and each large language model instance is adapted to automatically detect the type of each prompt.

18. The system of claim 15, wherein:

comparing the effectiveness of the different versions of the media comprises running a statistical analysis of the recorded responses of the generated AI subjects to the stimuli; and the statistical analysis report is based on the statistical analysis.

19. The system of claim 18, wherein running the statistical analysis comprises automatically determining which of a plurality of techniques to use for the statistical analysis.

20. The system of claim 18, wherein the hardware processor is further configured to automatically generate additional stimulus for further research, based on the results of the statistical analysis.

21. The system of claim 15, wherein comparing the effectiveness of the different versions comprises computing composite scores from the recorded structured responses using construct mappings, and performing statistical testing on the composite scores across the control group and the treatment group.

* * * * *